US00RE48798E

(19) United States
(12) Reissued Patent
Huang et al.

(10) Patent Number: US RE48,798 E
(45) Date of Reissued Patent: *Oct. 26, 2021

(54) LED DRIVER AND ILLUMINATION SYSTEM RELATED TO THE SAME

(71) Applicant: EPISTAR CORPORATION, Hsinchu (TW)

(72) Inventors: Chih-Shu Huang, Hsinchu (TW); Chang-Hseih Wu, Hsinchu (TW); Min-Hsun Hsieh, Hsinchu (TW)

(73) Assignee: EPISTAR CORPORATION, Hsinchu (TW)

( * ) Notice: This patent is subject to a terminal disclaimer.

(21) Appl. No.: 16/172,403

(22) Filed: Oct. 26, 2018

Related U.S. Patent Documents

Reissue of:
(64) Patent No.: 9,894,719
Issued: Feb. 13, 2018
Appl. No.: 15/059,053
Filed: Mar. 2, 2016

(30) Foreign Application Priority Data

| | | |
|---|---|---|
| Mar. 2, 2015 | (TW) | 104106489 |
| Mar. 26, 2015 | (TW) | 104109847 |
| Oct. 23, 2015 | (TW) | 104134998 |

(51) Int. Cl.

| | |
|---|---|
| ***H05B 33/08*** | (2020.01) |
| ***H02M 5/25*** | (2006.01) |
| ***H05B 45/31*** | (2020.01) |
| ***H05B 45/395*** | (2020.01) |
| ***H05B 45/355*** | (2020.01) |

(52) U.S. Cl.
CPC ..... *H05B 45/31* (2020.01); *H02M 5/25* (2013.01); *H05B 45/355* (2020.01); *H05B 45/395* (2020.01); *H01L 2224/48091* (2013.01); *Y02B 20/30* (2013.01)

(58) Field of Classification Search
CPC ..... H05B 33/08; H05B 33/0809; H05B 33/0803; H05B 33/0824; H02M 5/25; Y02B 20/348; H01L 33/0025
USPC ..... 363/125–128, 81–84; 315/151, 185, 315/224–226, 291, 294, 307, 308, 312, 315/201, 228, 297; 257/96
See application file for complete search history.

(56) References Cited

U.S. PATENT DOCUMENTS

| | | | | |
|---|---|---|---|---|
| 6,219,263 | B1 * | 4/2001 | Wuidart | H02M 1/32 363/125 |
| 7,944,411 | B2 | 5/2011 | Saeki | |
| 8,076,699 | B2 | 12/2011 | Chen et al. | |
| 8,304,916 | B1 * | 11/2012 | Sarkozy | H01L 23/66 257/774 |

(Continued)

FOREIGN PATENT DOCUMENTS

| | | | |
|---|---|---|---|
| CN | 102740561 | A | 10/2012 |
| JP | H09-331025 | A | 12/1997 |

(Continued)

*Primary Examiner* — My Trang Ton
(74) *Attorney, Agent, or Firm* — Muncy, Geissler, Olds and Lowe, P.C.

(57) ABSTRACT

A driver includes a semiconductor chip, a bridge rectifier, and a current driver. The semiconductor chip includes a rectifying diode and a constant current source formed thereon. The bridge rectifier includes the rectifying diode. The current driver includes the first constant current source to provide a constant current.

12 Claims, 19 Drawing Sheets

(56) References Cited

U.S. PATENT DOCUMENTS

| | | | | |
|---|---|---|---|---|
| 8,653,743 | B2 * | 2/2014 | Kitamura | H02M 3/156 315/224 |
| 9,071,130 | B2 * | 6/2015 | Kitamura | H02M 1/088 |
| 9,194,588 | B2 * | 11/2015 | Bach | F24B 5/02 |
| 9,220,135 | B2 * | 12/2015 | Huang | H05B 45/37 |
| 9,247,599 | B2 * | 1/2016 | Lee | H05B 37/02 |
| 2010/0117095 | A1 | 5/2010 | Zhang | |
| 2012/0280247 | A1 * | 11/2012 | Cheah | H01L 23/49524 257/76 |
| 2016/0174318 | A1 * | 6/2016 | Mignano | H05B 33/0845 315/201 |

FOREIGN PATENT DOCUMENTS

| | | | |
|---|---|---|---|
| JP | 2002-141516 | A | 5/2002 |
| JP | 2004-511913 | A | 4/2004 |
| JP | 2007-281551 | A | 10/2007 |
| JP | 2008-198735 | A | 8/2008 |
| JP | 2009-231644 | A | 10/2009 |
| JP | 2010-186925 | A | 8/2010 |
| JP | 2011-108018 | A | 6/2011 |
| JP | 2011-146263 | A | 7/2011 |
| JP | 2012-235101 | A | 11/2012 |
| JP | 2013-062462 | A | 4/2013 |
| JP | 2013-161781 | A | 8/2013 |
| JP | 2013-229975 | A | 11/2013 |
| JP | 2013-243257 | A | 12/2013 |
| JP | 2014-507752 | A | 3/2014 |
| KR | 10-2001-0055888 | A | 7/2001 |
| KR | 10-1069550 | B1 | 10/2011 |
| KR | 2013-0011820 | A | 1/2013 |
| TW | 201227208 | A1 | 7/2012 |
| TW | 201336064 | A | 9/2013 |

* cited by examiner

LED DRIVER AND ILLUMINATION SYSTEM RELATED TO THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

*This application is a reissue of U.S. application Ser. No. 15/059,053.*

The present application is a non-provisional patent application, claiming the benefit of priority of TW Patent Application No. 104134998 filed on Oct. 23, 2015, TW Patent Application No. 104106489 filed on Mar. 2, 2015, and TW Patent Application No. 104109847 filed on Mar. 26, 2015.

TECHNICAL FIELD

The present disclosure relates to an LED driver and a related illumination system, in particular to a driver and an illumination system.

DESCRIPTION OF THE RELATED ART

The lighting apparatus having light-emitting diode (LED) are gradually replacing CCFL (Cold Cathode Fluorescent Lamp) or incandescent light bulbs to be the light source of back light or lighting systems because of great transition efficiency between power and light and its smaller size. The LED is driven by DC power, such as a 3 Volt DC, but the mains electric supply provides AC input power. Therefore, a power converter for converting an AC input power source to a proper DC power is needed.

The power consumed by lighting application needs is accounted for the majority of the mains electric supply so the power converter for lighting is regulated to provide low transition loss and good power factor (between 0 and 1) by law. The electrical characteristic of an electronic device is more like a resistive load when its power factor is closer to 1.

FIG. 1 shows an illumination system 10 having a bridge rectifier 12, a power factor corrector 14, an LED driver circuit 16, and an LED 18. The power factor corrector 14 can be a booster circuit. The LED driver circuit 16 can be a buck converter. When the power converter is a switch type, such as boost circuit or a buck converter, it needs a bulky and expensive inductor, and the illumination system needs many electrical devices, which increases the cost for an illumination system including a power converter of switch type.

SUMMARY OF THE DISCLOSURE

A driver includes a semiconductor chip, a bridge rectifier, and a current driver. The semiconductor chip includes a rectifying diode and a constant current source formed thereon. The bridge rectifier includes the rectifying diode. The current driver includes the first constant current source to provide a constant current.

A driver is connected to a DC power line and a ground power line and includes a buffer layer, a bridge rectifier, and a constant current source. The buffer layer has a GaN based material. The bridge rectifier is formed on the buffer layer and has a rectifying diode. The constant current source is formed on the buffer layer. The first constant current source is connected between the DC power line and the ground power line to provide a constant current.

A driver includes a bridge rectifier, a first thermistor, a second thermistor, a first constant current source, a second constant current source and a third constant current source. The second thermistor has a temperature coefficient different from that of the first thermistor. [The] *Two ends of the* first constant current source is connected to *two ends of* the first thermistor [in parallel]. [The] *Two ends of the* second constant current source is connected to *two ends of* the second thermistor [in parallel]. The bridge rectifier includes an end connected to the first constant current source, the second constant current source and the third constant current source.

The following description illustrates embodiments and together with drawings to provide a further understanding of the disclosure described above.

DETAILED DESCRIPTION OF THE EMBODIMENTS

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed. It is noted that the elements not drawn or described in the figure can be included in the present application by the skilled person in the art.

The LED illumination system disclosed in the present disclosure has a concise circuit design. The main elements of the LED illumination system include an integrated circuit with a packaged single semiconductor chip, two capacitors and an LED as a lighting source. There is no need to connect to additional inductor for the LED illumination system. Besides, the LED illumination system provides good power factor which meets the requirement of most certifications.

Figure 1:
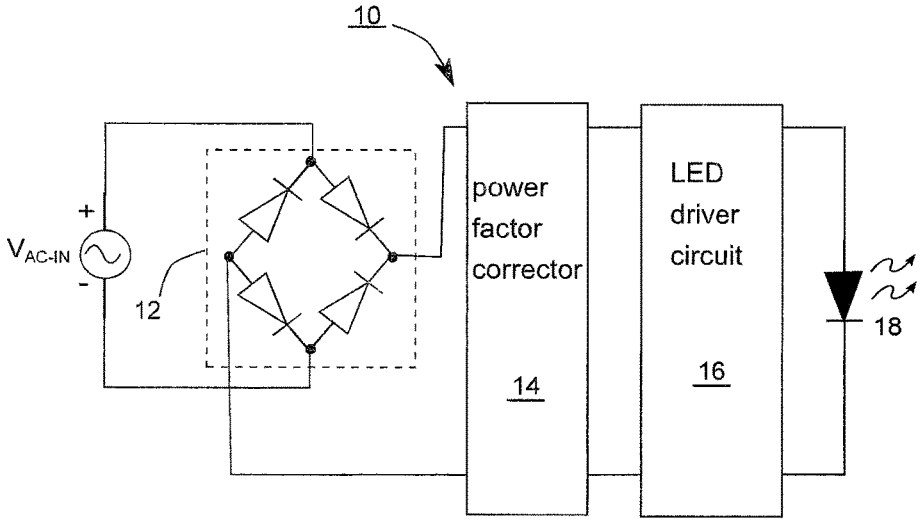
FIG. 1 (Prior Art)
FIG. 1 shows a conventional illumination system.
Figure 2:
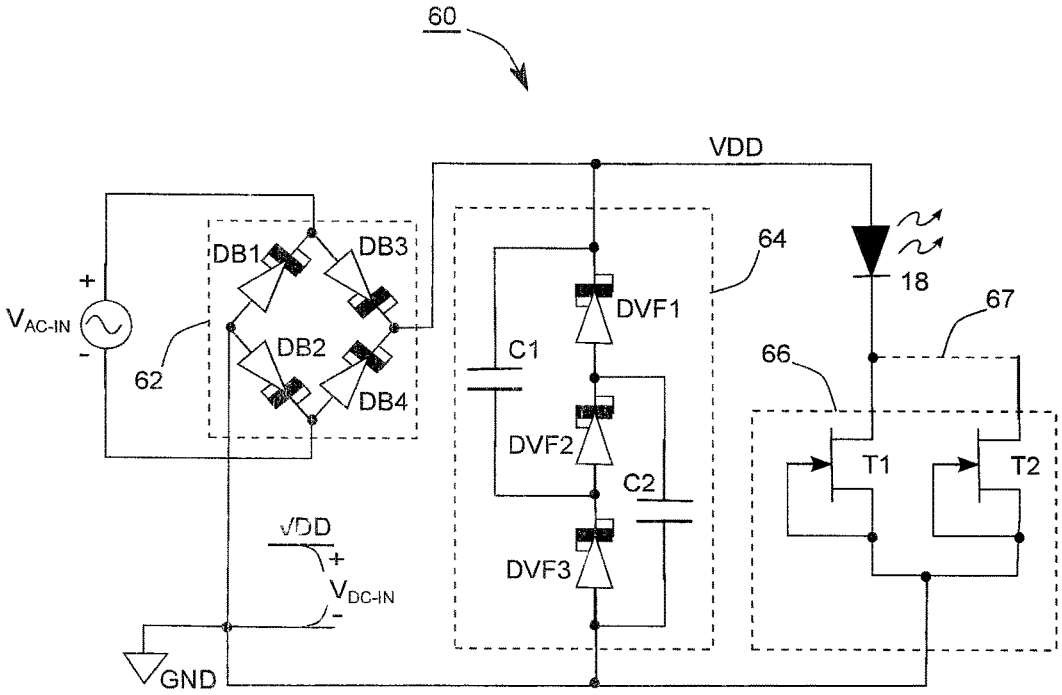
FIG. 2 shows an LED driver disclosed in an embodiment of the present disclosure.

FIG. 2 shows an LED driver 60 disclosed in the present disclosure capable of driving an LED 18. The LED 18 can be a high voltage LED having multiple LED units of smaller sizes connected in series. For example, the LED 18 in one embodiment has 15 LED units of smaller sizes (having a forward voltage of 3.4 V) connected in series, and the equivalent forward voltage of the LED 18 is around 50V.

The LED driver 60 has three stages. The first stage connected to the AC input power $V_{AC\text{-}IN}$ is a bridge rectifier 62. The second stage is a valley-filled circuit, functioned as a power factor corrector, to improve the power factor of the LED driver 60. The third stage includes two HEMTs (high electron mobility transistor) T1 and T2 to be a current driver 66. The HEMTs T1 and T2 can be functioned as a constant current source respectively or connected together in parallel to be a constant current source providing larger current. Take the HEMT T1 as an example, while the voltage $V_{DS}$ (drain-to-source voltage) is large enough to turn on the HEMT, the current $I_{DS}$ (drain-to-source current) from drain to source is substantially a constant value which is barely changed with the voltage $V_{DS}$. So, the HEMT T1 provides a current substantially of same value to drive an LED 18.

The bridge rectifier 62 includes four rectifying diodes DB1-DB4, and all of the four rectifying diodes can be SBDs (Schottky Barrier Diode). The bridge rectifier 62 converts the voltage from the AC input power $V_{AC\text{-}IN}$ to a DC power $V_{DC\text{-}IN}$ between the DC power line and ground power line GND. For example, the AC input power can be a $110V_{AC}$ or $220V_{AC}$ provided by mains electric supply.

The valley-filled circuit 64 is connected to the DC power line VDD and the ground power line GND and includes three diodes DVF1-DVF3 and capacitors C1 and C2. The diodes DVF1-DVF3 are reversely connected in series between the DC power line VDD and the ground power line GND. In this embodiment, the capacitance value of the capacitors C1 and C2 are substantially the same. Theoretically, the voltages $V_{C1}$ and $V_{C2}$ of the capacitors C1 and C2 can be charged to a value equal to a half of the peak value of the voltage provided by the DC power source $V_{DC\text{-}IN}$ ($0.5*V_{PEAK}$). While the absolute value of the AC input power $V_{AC\text{-}IN}$ is less than ($0.5*V_{PEAK}$), the capacitors C1 and C2 charges the DC power line VDD and the ground power line GND. Once the values of the capacitors C1 and C2 are large enough, the minimum value of the voltage provided by the DC power source can be maintained to be substantially equal to $0.5*V_{PEAK}$ by the valley-filled circuit 64 to provide sufficient power to turn on the LED 18.

The HEMT T1 and HEMT T2 are depletion mode transistors, and values of the threshold voltages ($V_{TH}$) are negative. Each HEMT has a gate electrode (or gate end) and two channel electrodes of a source electrode and a drain electrode (or a source end and a drain end). There is short circuit between gate electrode and source electrode in HEMT T1 and in HEMT T2. Take the HEMT T1 as an example, while the voltage $V_{DS}$ (drain-to-source voltage) is large enough to turn on the HEMT, the current $I_{DS}$ (drain-to-source current) from drain to source is substantially a constant value which is barely changed with the voltage $V_{DS}$. Therefore, each of the HEMT T1 or T2 can be functioned as a constant current source to provide a constant current to drive the LED 18. The light intensity of the LED 19 can be remained at the same level without flicker. In FIG. 2, the LED 18 is driven by HEMT T1, and both the LED 18 and the HEMT T1 are regarded as loads connected in series between the DC power line VDD and the ground power line GND. As shown in FIG. 2, the HEMT T2 is connected to the LED 18 by the dashed line 67, which means the HEMT T2 can be optionally connected to the HEMT T1 to drive the LED 18 together, which will be discussed in detail in the following paragraphs. Some or all parts in the LED driver 60 can be formed on a semiconductor chip. In one embodiment, the bridge rectifier 62 and the current driver 66 are formed on the same semiconductor chip so the rectifying diode DB1 of the bridge rectifier 62 and the HEMT T1 configured as a constant current source are formed on the same semiconductor chip. In another embodiment, the bridge rectifier 62, the valley-filled circuit 64 and the current driver 66 are formed on the same semiconductor chip.

Figure 3:
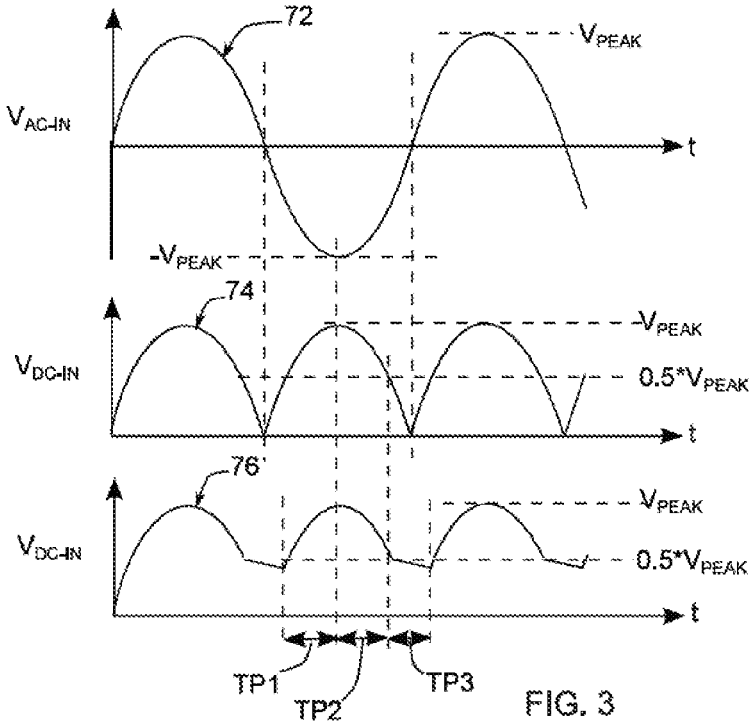
FIG. 3 shows voltage waveforms disclosed in an embodiment of the present disclosure.

FIG. 3 shows a voltage waveform 72 of the voltage provided by the AC input power source, a waveform 74 of the voltage provided by the DC power source without valley-filled circuit 64, and a waveform 76 of DC power source with valley-filled circuit 64. For example, the waveform 72 of the AC input power is a sine wave with $220V_{AC}$ as shown in FIG. 3. The waveform 74 shows the simulation result when there is no valley-filled circuit 64. When no valley-filled circuit 64 is applied, the bridge rectifier 62 provides a concise full wave rectification (such as without voltage modification or without time period adjustment) to turn the negative part of the waveform 72 into the positive part as the waveform 74 shows. The valley-filled circuit 64 fills up the valley of the waveform 74 or makes the valley of the waveform 74 shallower as the waveform 76 shows. For convenience of description, the following paragraphs describe the procedure (or actions) of the circuit by describing the waveform 74. For example, the situation of "the waveform 74 reaches the peak" also implies the waveform 72 (AC input power source) reaches the peak or the valley.

Period TP1 begins when the value of waveform 74 is larger than waveform 76 and ends when the value of the waveform 76 is increased by time and reaches the peak value $V_{PEAK}$. During the period TP1, the power driving the LED 18 to emit light comes from the AC input power source so the waveform 76 equals to the waveform 74. At this moment, when the value of the DC power source $V_{DC\text{-}IN}$ is larger than the sum of voltages $V_{C1}$ and $V_{C2}$, the capacitors C1 and C2 are charged by AC input power source. When waveform 74 reaches the peak value, the voltage values of capacitors $V_{C1}$ and $V_{C2}$ are substantially equal to $0.5*V_{PEAK}$.

Period TP2 begins when the value of the waveform 74 reaches the $V_{PEAK}$, ends when the value of the waveform 74 decreased and reaches the half of the $V_{PEAK}$. During period TP2, the value of the waveform 74 decreases by time and the power driving the LED 18 to emit light comes from the AC input power source, so the waveform 76 equals to the waveform 74. Because the capacitors C1 and C2 do not charge or discharge, so the voltage values of capacitors $V_{C1}$ and $V_{C2}$ are maintained at $0.5*V_{PEAK}$.

Period TP3 begins at the time when the value of the waveform 74 is lower than $0.5*V_{PEAK}$, and the time is substantially when the waveform 74 reaches its valley. In the period TP3, the capacitor C1 discharges through the diode DVF3 to provide power to the HEMT T1 and LED 18. Similarly, the capacitor C2 discharges through the diode DVF1 to provide power to the HEMT T1 and LED 18. The voltage value of voltage $V_{C1}$ and the voltage value of voltage $V_{C2}$ are decreased by time, and the decreasing speed depends on the capacitance of the capacitor C1 and the capacitance of the capacitor C2 respectively. Period TP3 ends when the value of the waveform 74 is bounced back to be larger than the voltage value $V_{C1}$ or $V_{C2}$. Then another period TP1 comes after the end of the period TP3. As the waveform 76 shows in FIG. 3, once the sum of the capacitances of capacitor C1 and C2 is large enough, the DC power $V_{DC\text{-}IN}$ is capable of keeping driving the LED 18 to emit light.

As long as the sum of the capacitances of the capacitors C1 and C2 are large enough, the power factor adjusted by the valley-filled circuit 64 can be tuned to meet power factor requirements of most countries.

Figure 4A:
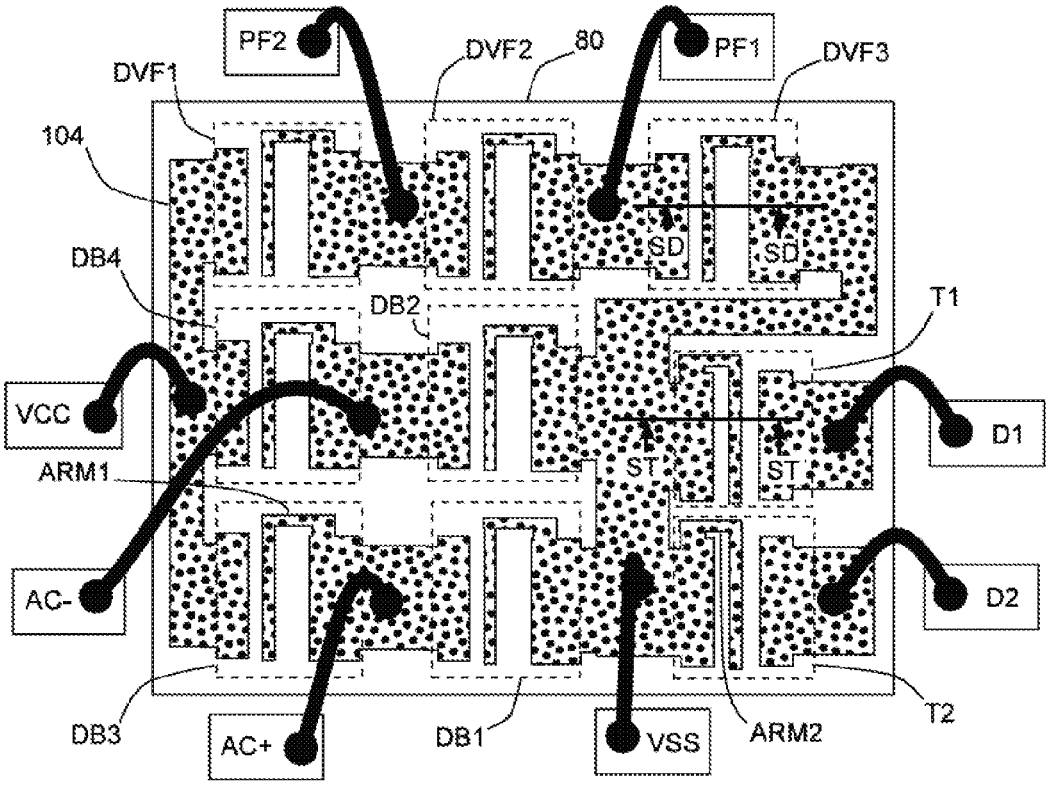
FIG. 4A shows a pattern of a metal layer on a semiconductor chip disclosed in an embodiment of the present disclosure.
Figure 5:
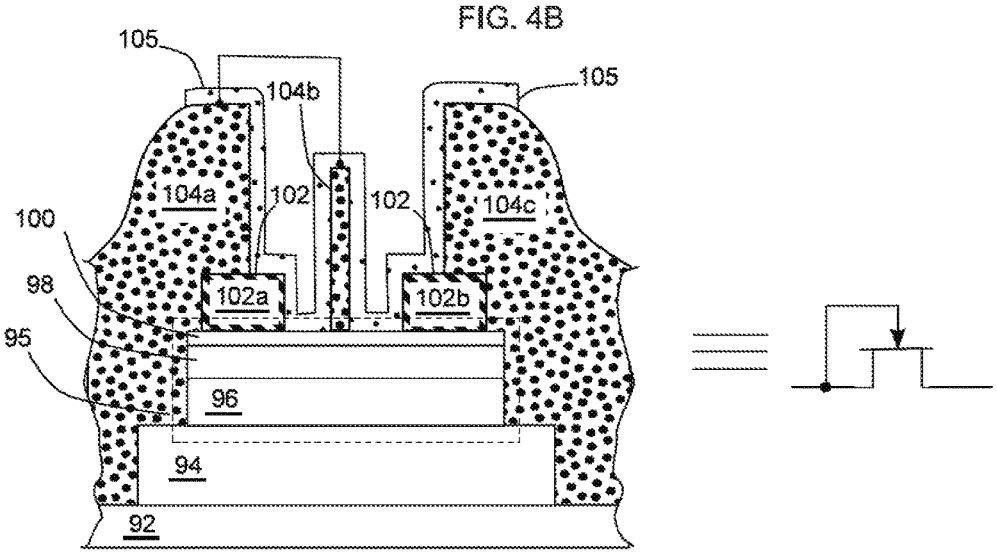
FIG. 5 shows a cross-sectional view of the HEMT T1 along the line ST-ST in FIG. 4A disclosed in an embodiment of the present disclosure.
Figure 6:
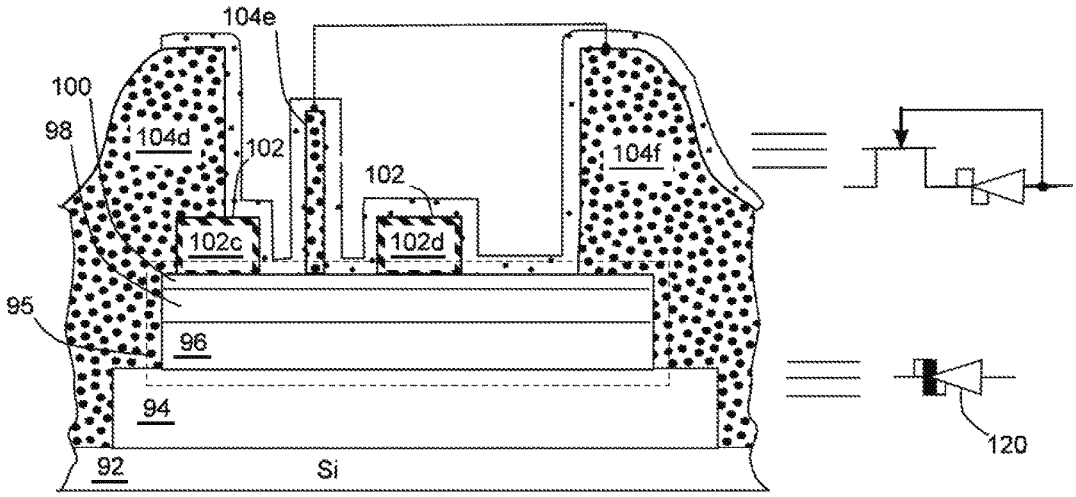
FIG. 6 shows a cross-sectional view of the diode DVF3 along the line SD-SD in FIG. 4A.

In an embodiment, the rectifying diodes DB1-DB4, diodes DVF1-DVF3 and HEMTs T1 and T2 are commonly formed on a single semiconductor chip. FIG. 4A shows a pattern of a metal layer 104 on a semiconductor chip 80, and the relative positions of the diode and the HEMT in FIG. 2. Semiconductor chip 80 can be a MMIC (monolithic microwave integrated circuit) having a GaN-based channel. In FIG. 4A, the diodes are Schottky Barrier Diodes having similar structures, and the HEMTs T1 and T2 are constructed of similar structures. FIG. 5 shows a cross-sectional view of the HEMT T1 along the line ST-ST in FIG. 4A. FIG. 6 shows a cross-sectional view of the diode DVF3 along the line SD-SD in FIG. 4A. The structures of other diodes and HEMTs can be derived from these figures.

In the embodiment shown in FIG. 5, the material of the buffer layer 94 on the silicon base 92 can be carbon doped (C-doped) GaN. The channel layer 96 can be made of intrinsic GaN and a high-band gap layer 98 is formed on the channel layer 96. The cover layer 100 can be intrinsic GaN. The cover layer 100, the high-band gap layer 98, and the channel layer 96 can be patterned as a mesa 95. The 2D-electron gas can be formed in the channel layer 96 adjacent to the quantum well of high-bandgap layer 98 as a conductive channel. The material of the patterned metal layer 102 can be titanium, aluminum or a stack of titanium and aluminum. As shown in FIG. 5, the metal layer 102 forms two metal strips 102a and 102b on top of the mesa 95 as two ohmic contacts, and the metal strips 102a and 102b are functioned as a drain electrode and a source electrode respectively. The metal layer 104 can be made of titanium, gold or stacking titanium and aluminum. The metal layer 104 can also have a layer of nickel, a layer of copper and a layer of platinum from bottom to top. The layer of platinum is used to increase adhesion between the metal layer 104 and the protection layer 105 formed in the following steps, and to prevent peeling issue while forming the bonding pad. In another embodiment, the metal layer 104 can be made by stacking nickel, aluminum, and platinum or by stacking nickel, gold, and titanium. As shown in FIG. 5, metal strips 104a, 104b, and 104c are formed by patterning the metal layer 104. The metal strip 104b forms a Schottky contact above the middle of mesa 95 to be a gate electrode of the HEMT T1. Metal strips 104a and 104c respectively contacts the metal strips 102a and 102b to provide an electrical connection between source electrode and other electrical elements and an electrical connection between drain electrode and other electrical elements. Referring to FIG. 5 and FIG. 4A, the gate electrode (i.e. metal strip 104b) of HEMT T1 is directly connected to the metal strip 104a, and connected to the source electrode of HEMT T1. In another embodiment, the metal strip 104b can be connected to the metal strip 104a through an additional metal strip. The right part of FIG. 5 shows an equivalent circuit diagram of HEMT T1. A protection layer 105 is formed on the metal strip 104a, metal strip 104b, and the metal strip 104c, and the material of the protection layer 105 can be SiON (silicon oxynitride). The protection layer 105 is patterned to form bonding pads for packaging. For example, in FIG. 5, the left part of the protection layer 105 which is not covered can be welded to a bonding wire connected to a low voltage pin VSS (described in following paragraphs); while the right part of the protection layer 105 which is not covered can be welded to a bonding wire connected to a driving pin D1 (described in following paragraphs).

For brevity, same or similar parts between FIG. 5 and FIG. 6 are not repeated. In FIG. 6, the metal layer 102 forms two metal strips 102c and 102d, and the metal strips 104d, 104e and 104f are formed by patterning the metal layer 104. Similar with FIG. 5, the metal strip 104e can be used as a gate electrode of the HEMT. Though the metal strip 102d can be used as a source electrode of the HEMT, the metal strip 102d does not directly contact with the metal strips 104d, 104e and 104f. In another embodiment, the metal strip 102d can be omitted. The metal strip 104f is connected to the mesa 95 on part of the top surface and a side wall to form another Schottky contact to form a Schottky Barrier diode having a cathode equivalently connected to the source electrode of the HEMT in FIG. 6. Referring to FIG. 6 and FIG. 4A, the metal strip 104e, which is directly connected to the metal strip 104f, is used as an anode of the Schottky Barrier diode. In another embodiment, the metal strip 104e is connected to the metal strip 104f through an additional metal strip. The right part of FIG. 6 shows the equivalent circuit diagram of the left part, wherein the circuit is functioned as a diode. The right part of FIG. 6 simultaneously shows a special diode symbol 120 representing the equivalent circuit diagram in FIG. 6. The diode symbol 120 is also used in FIG. 2 to represent rectifying diodes DB1-DB4 and diodes DVF1-DVF3, and each of the diodes is composed of a HEMT and a Schottky Barrier diode.

Figure 4B:
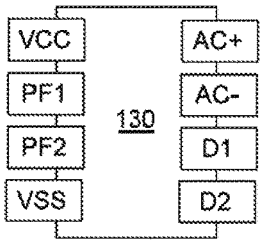
FIG. 4B shows a schematic view of a packaged semiconductor chip disclosed in FIG. 4A.

FIG. 4B shows an integrated circuit 130 formed by packaging the semiconductor chip 80. The integrated circuit 130 has 8 pins of high voltage pin VCC, correction pins PF1 and PF2, low voltage pin VSS, AC input pins AC+ and AC−, and driving pins D1 and D2. Referring to FIG. 4A, the pins are electrically connected to the metal strips formed by patterning the metal layer 104 through bonding wires. Theses metal strips also provide connections between corresponding input nodes and output nodes of electrical elements in the semiconductor chip 80. For example, the driving pin D1 is electrically connected to the drain electrode of HEMT T1, and the correction pin PF1 is electrically connected to the cathode electrode of diode DVF3.

Figure 7:
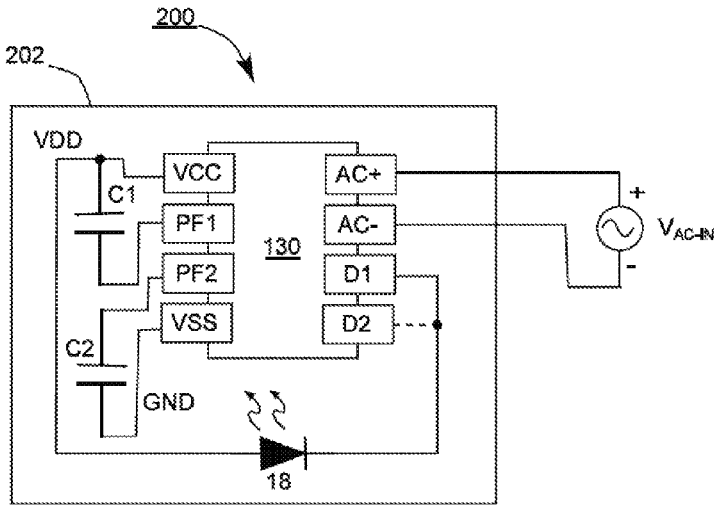
FIG. 7 shows an illumination system disclosed in an embodiment of the present disclosure.

FIG. 7 shows an illumination system 200 disclosed in the present disclosure. The integrated circuit 130 is fixed to a printed circuit board 202. Through the metal wires on the printed circuit board 202, the capacitor C1 is electrically connected to the high voltage pin VCC and the correction pin PF1, the capacitor C2 is electrically connected to the low voltage pin VSS and the correction pin PF2, the LED 18 is electrically connected to the high voltage pin VCC and the driving pin D1, and the AC input pins AC+ and AC− are connected to the AC input power $V_{AC\text{-}IN}$. According to the above explanation, the illumination system 200 shown in FIG. 7 realizes the LED driving circuit 60 disclosed in FIG. 2 concisely by only four elements (two capacitors C1 and C2, integrated circuit 130, and an LED). No expensive and bulky inductance is applied so the cost of illumination system 200 is lowered and the size of the total product can be downsized.

As shown in FIG. 7, the driving pin D2 (electrically to the drain electrode of HEMT T2) can be optionally connected to the LED 18 based on the voltage of the AC input power $V_{AC\text{-}IN}$. In other words, the integrated circuit 130 is able to optionally use one HEMT T1 or two HEMTs T1 and T2 connected in parallel to drive the LED 18 to emit light. For example, the size of HEMTs T1 and T2 are the same, and the HEMTs T1 and T2 are able to provide same constant current of about 1 μA. When the AC input power source provides a voltage of $110V_{AC}$ to the illumination system 200, an LED having a forward voltage value of 50V is chosen as the LED 18, and the driving pins D1 and D2 are connected to the LED 18. The power consumed by the LED 18 is about 100 μW (=2 μA*50V). When the AC input power source provides a voltage of $220V_{AC}$ to the illumination system 200, an LED having a forward voltage value of 100V is chosen as the LED 18, and the driving pin D2 is floating. The power consumed by the LED 18 is about 100 μW (=1 μA*100V). Thus, although the voltage values of the AC input power source are different, LEDs having different forward voltages can be chosen to be LED 18 to have about the same power consumed by the LED 18 so the light intensity provided by the illumination system 200 under different input voltages is substantially the same. In other words, the integrated circuit 130 is not only suitable for the AC input power source of $220V_{AC}$ type but also suitable for AC input power source of $110V_{AC}$ type. This characteristic benefits the manufacturers of illumination system 200 because the cost of production control of illumination system 200 can be saved.

Figure 8:
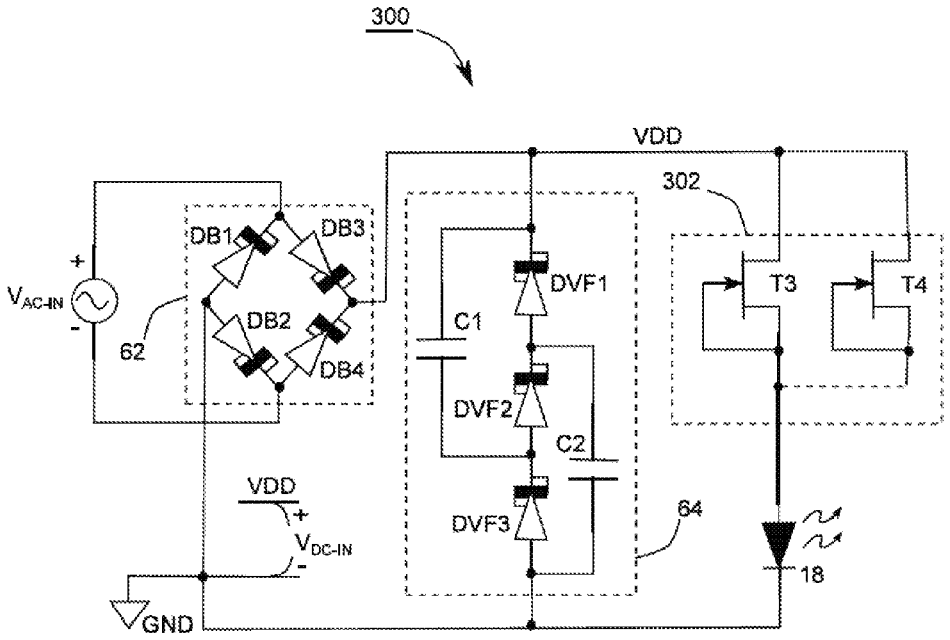
FIG. 8 shows an LED driver disclosed in another embodiment of the present disclosure.
Figure 9A:
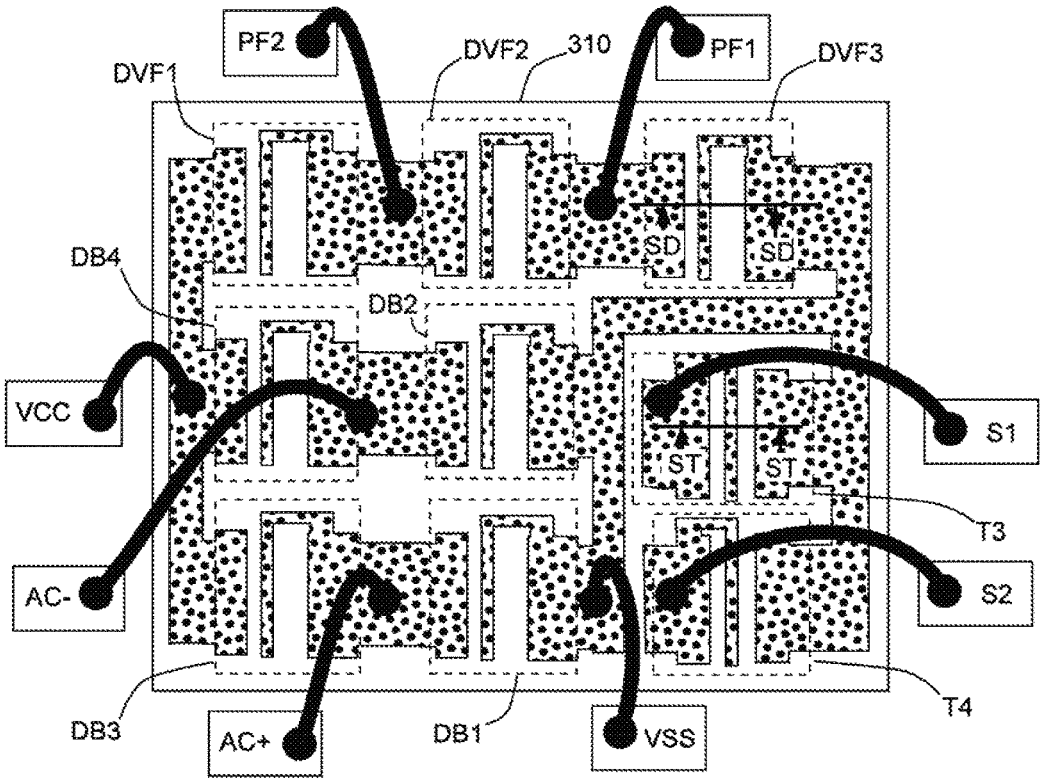
FIG. 9A shows a pattern of a metal layer on a semiconductor chip disclosed in an embodiment of the present disclosure.
Figure 9B:
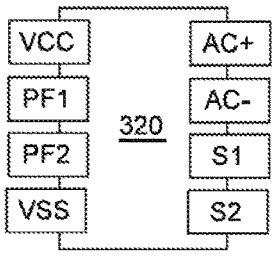
FIG. 9B shows a schematic view of a packaged semiconductor chip disclosed in FIG. 9A.
Figure 10:
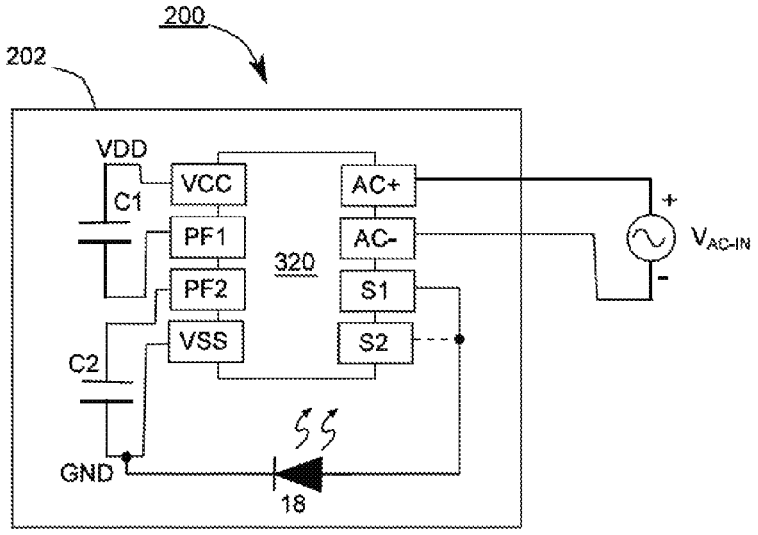
FIG. 10 shows an illumination system accommodating the LED driver in FIG. 8.

As shown in FIG. 2, the current driver 66 is connected to the LED 18 and the ground power line GND, but the present disclosure is not limited to this embodiment. FIG. 8 shows an LED driver 300 disclosed in one embodiment of the present disclosure to drive the LED 18. The current driver 302 in FIG. 8 has HEMTs T3 and T4. The drain electrodes of HEMTs T3 and T4 are electrically connected to the DC power line VDD and the LED 18 is connected to the ground power line GND and the current driver 302. FIG. 9A shows a pattern of a metal layer 140 on a semiconductor chip 310 while the relative positions of the diode and the HEMT in FIG. 8 are labeled. FIG. 5 shows a cross-sectional view of the HEMT T3 along the line ST-ST in FIG. 9A. FIG. 6 shows a cross-sectional view of the diode DVF3 along the line SD-SD in FIG. 9A. FIG. 9B shows an integrated circuit 320 having a packaged semiconductor chip 310. The integrated circuit 320 has 8 pins of high voltage pin VCC, correction pins PF1 and PF2, low voltage pin VSS, AC input pins AC+ and AC−, and driving pins D1 and D2. FIG. 10 shows another illumination system 330 disclosed in the present disclosure, wherein the illumination system 330 realize the LED driver 300 in FIG. 8. The description of FIGS. 8, 9A, 9B and 10 can be referred to paragraphs related to FIGS. 2, 4A, 4B and 7 shown above to realize the theory, operation and benefits, and the descriptions are omitted for brevity.

Figure 11:
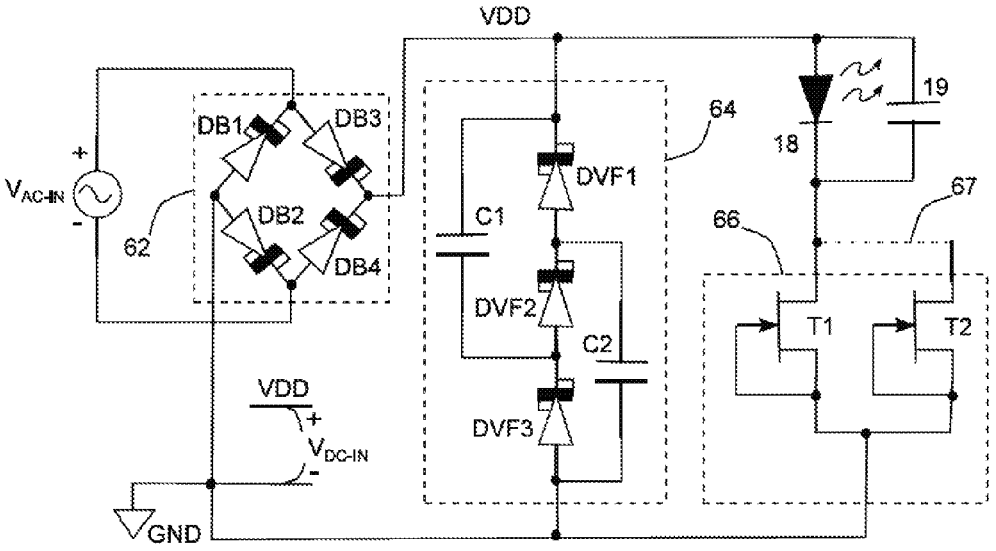
FIG. 11 shows a circuit including an LED and an additional capacitor connected [in parallel] disclosed in another embodiment of the present disclosure.

As the embodiment shown in FIG. 11, an additional capacitor 19 for stabilizing the voltage is used to connect with the LED 18 in parallel. The capacitor 19 is used to lower the variation of voltage applied on the LED 18 and even increase the duty cycle or light emitting time of the LED within a period of the voltage provided by the AC input power $V_{AC\text{-}IN}$ to eliminate the possibility of flickering of LED 18.

Figure 12:
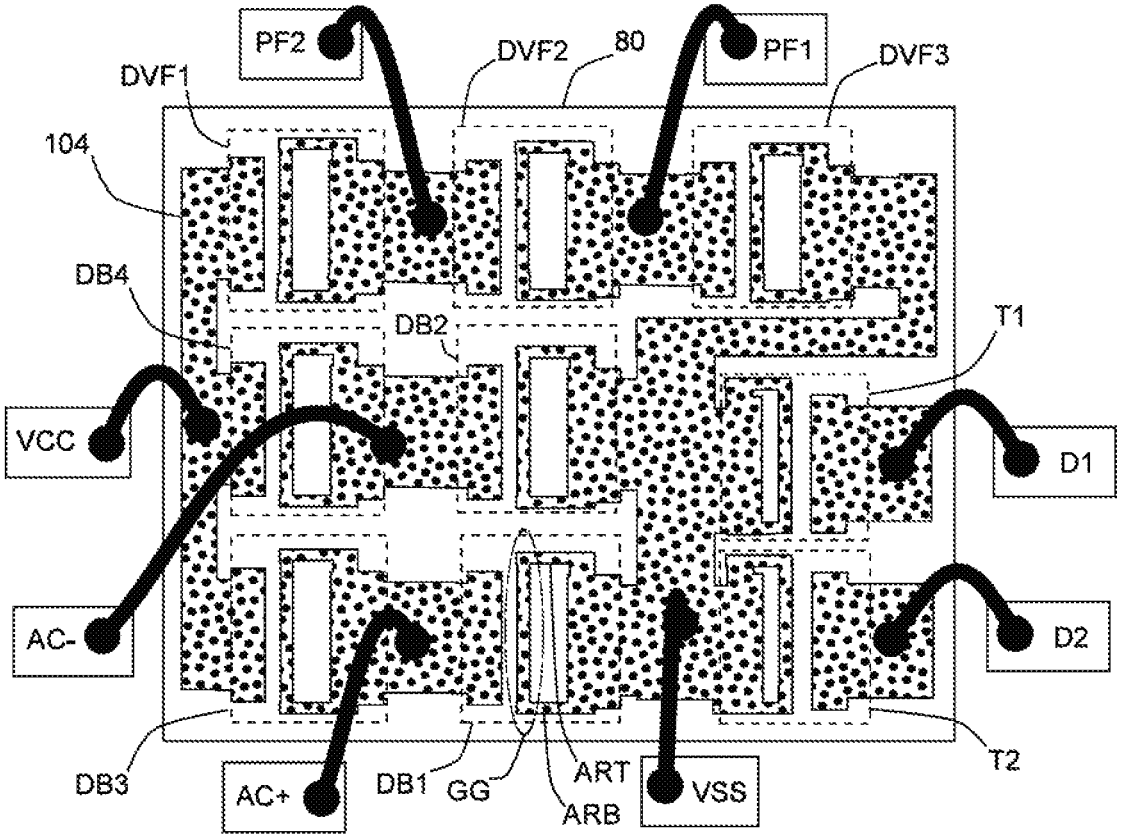
FIG. 12 shows a pattern of a metal layer on a semiconductor chip disclosed in another embodiment of the present disclosure.

The pattern in FIG. 4 demonstrates one embodiment while the presented disclosure is not limited to the embodiment. FIG. 12 shows a pattern of metal layer 104 on another semiconductor chip. FIG. 12 is similar to FIG. 4 so the same parts or similar parts between the figures are omitted for brevity. In FIG. 4A, the gate electrode located at the center of one diode only connects to its anode electrode through an arm ARM 1 formed by patterning the metal layer 104, such as the metal strip 104f in FIG. 6. The gate electrode located at the center of one HEMT also connects to its source electrode through an arm ARM 2 formed by patterning the metal layer 104, such as the metal strip 104a in FIG. 5. In FIG. 12, as the gate area GG shown in the figure, the gate electrode located at the center of one diode connects to its anode electrode through the arms ART and ARB, and the gate electrode located at the center of one HEMT also connects to its source electrode through the arms. Compared with the design in FIG. 4A, the arms of the diode in FIG. 12 is more symmetrical for manufacturing so the structures of the arms are not easily compressed by other structures above and below the arms during process, such as developing, exposure, epitaxial and etching. The widths of the arms are more uniform and the structures are not likely to be broken or deformed. On the contrary, the structure in FIG. 4A has only one arm so the width of the arm is uneven during manufacturing other parts. Such varied width is likely to induce breakdown by crowding of high voltage or large current. Because the structures of arms in FIG. 12 have uniform widths, the structures are not easily deformed by other structures so the structures in FIG. 12 provide better breakdown voltage protection. In other words, the structure can be operated at a higher voltage so the HEMT has a higher breakdown voltage.

Figure 13:
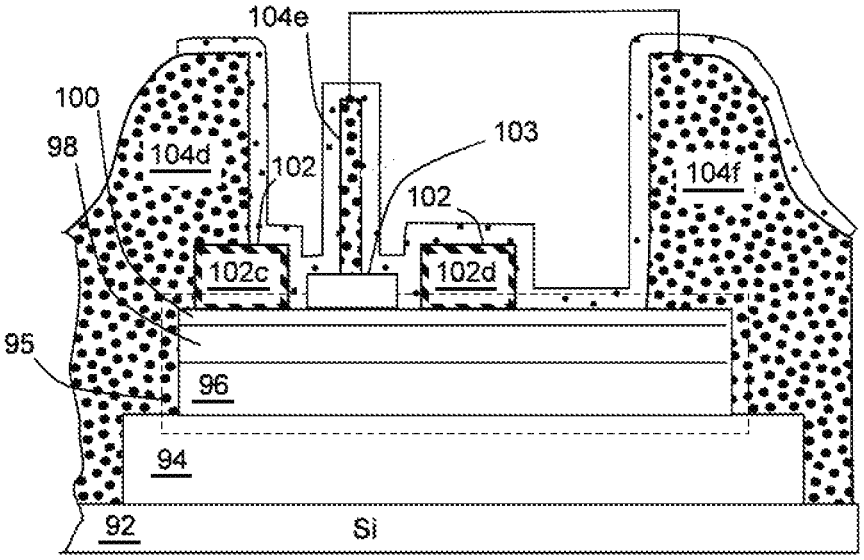
FIG. 13 shows a cross-sectional view of the diode DVF3 along the line SD-SD in FIG. 4A disclosed in another embodiment of the present disclosure.

The cross-sectional views in FIGS. 5 and 6 are embodiments that are not limitations to the disclosure. For example, FIG. 13 shows the cross-sectional view of the diode DVF3 along the line SD-SD in FIG. 4A. For brevity, the same or similar parts in FIG. 13 and FIG. 6 are not described again. The difference between FIG. 6 and FIG. 13 is an insulation layer 103 in FIG. 13 formed between the metal strip 104e and the cover 100, and the material of the insulation layer 103 can be silicon oxide. The insulation layer 103 is used to improve the performance of the diode by having a higher breakdown voltage.

Figure 14:
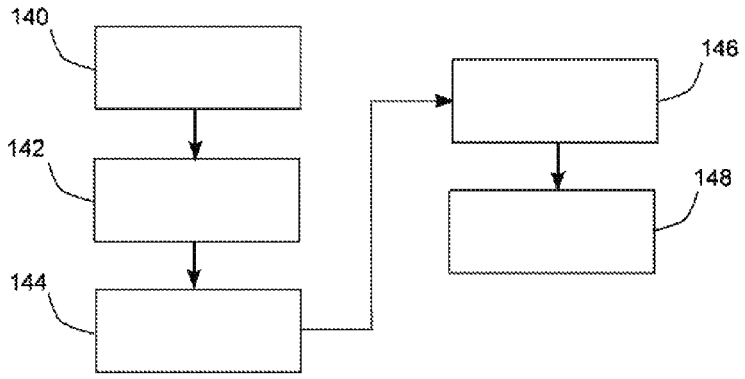
FIG. 14 shows a flow chart of manufacturing a diode disclosed in FIG. 13.

FIG. 14 shows a flow chart of manufacturing a diode in FIG. 13. A mesa is formed in step 140. For example, a channel layer 96, a high-band gap layer 98 and a cover 100 are formed on a buffer layer 94 in advance. Then, these three layers are patterned to form the mesa 95 by ICP (Inductively Coupled Plasma etching) for example. An ohmic contact is formed in the step 142. For example, the metal layer 102 is formed by depositing titanium, aluminum, titanium and gold, and the metal layer 102 is patterned to from metal strips, such as metal strips 102a and 102b. An insulation layer 103 is formed in step 144. For example, a silicon dioxide layer is deposited to be patterned, and the rest of the silicon dioxide layer is used as the insulation layer 103. A Schottky contact and a patterning process are performed in step 146. For example, nickel, gold and platinum are sequentially deposited to form the metal layer 104 which is patterned later to form metal strips, such as metal strip 104a, metal strip 104b and metal strip 104c. The interface between the metal layer 104 and the metal layer 102 is an ohmic contact, and the interface between the metal layer 104 and the mesa 95 is a Schottky contact. A protection layer 105 is formed which is pattered later to form holes for bonding pads in the step 148. The flow chart of manufacture shown in FIG. 14 can be adapted to form a HEMT in FIG. 12. With adjustment, the flow chart in FIG. 14 can be applied to form a diode and a HEMT in FIG. 4A, such as skipping step 144 or adding another process.

Figure 15:
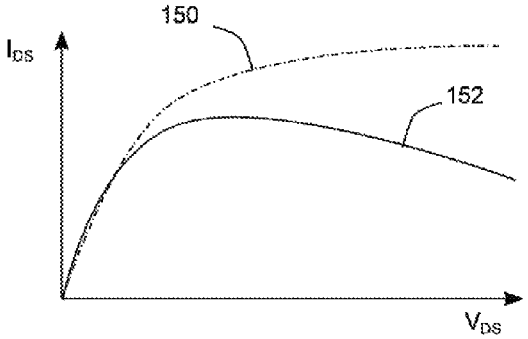
FIG. 15 shows a drawing of the relationship between $I_{DS}$ and $V_{DS}$ of a MOSFET and a HEMT disclosed in another embodiment of the present disclosure.

The HEMTs T1 and T5 in FIG. 2 and FIG. 5 can be considered as constant current sources, but those transistors may not be ideal current sources. Drain currents ($I_{DS}$) of HEMTs T1 and T2 may be related to the drain voltage ($V_{DS}$) while the transistors are operated in the saturation region. FIG. 15 shows the relationship between $I_{DS}$ and $V_{DS}$ of a MOSFET and a HEMT. Curve 150 is related to a silicon-based MOSFET and the curve 152 is related to a HEMT. According to curve 150, the current $I_{DS}$ and voltage $V_{DS}$ are substantially positively correlated in a MOSFET, wherein the current $I_{DS}$ is increased as the voltage $V_{DS}$ is increased. But, it is different in HEMT. According to curve 152, the relationship between the voltage $V_{DS}$ and current $I_{DS}$ changes from positive correlation to negative correlation while the voltage is higher than a specific value in HEMT. The specific value can be set by tuning manufacturing parameters. This characteristic of HEMT is beneficial for operation, for example, while the voltage $V_{DS}$ surges because of unstable input voltage, the current $I_{DS}$ is decreased to lower the electrically power consumed by the HEMT so the HEMT avoids being burned down.

Figure 16:
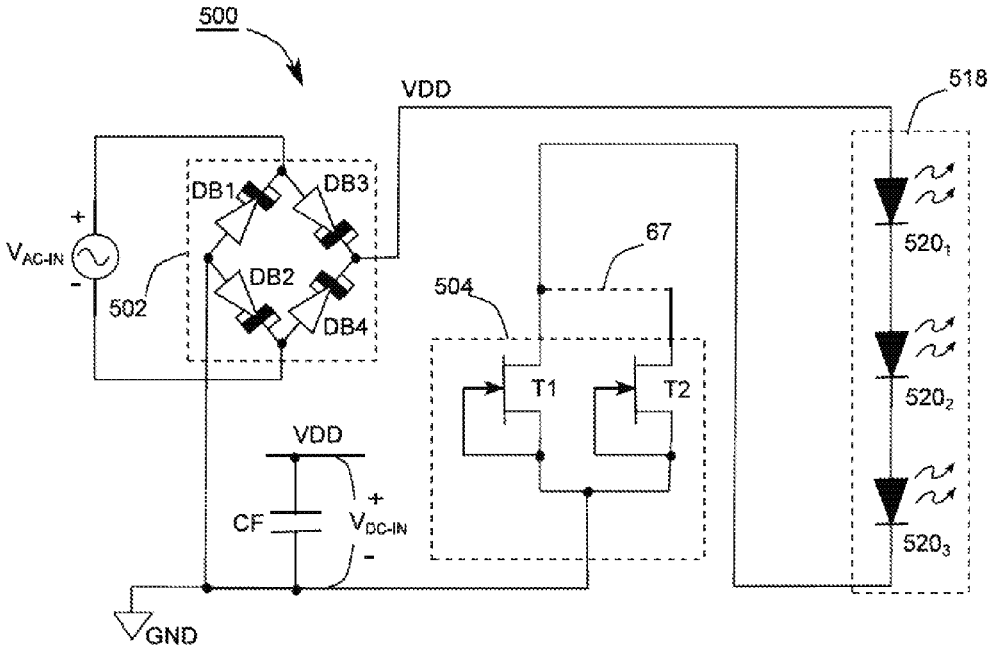
FIG. 16 shows an LED driver disclosed in further another embodiment of the present disclosure.
Figure 17:
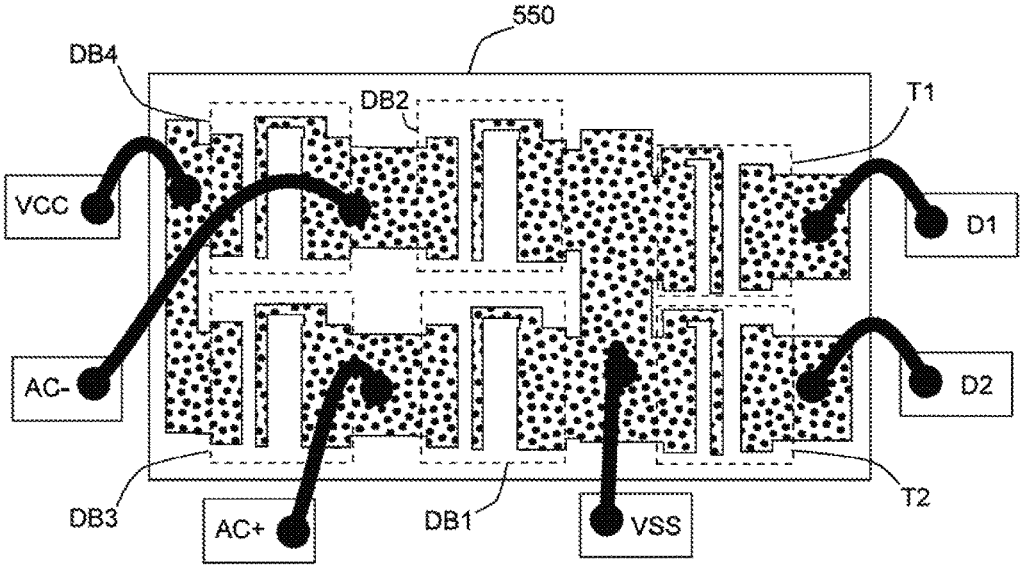
FIG. 17 shows a pattern of a metal layer on a semiconductor chip disclosed in further another embodiment of the present disclosure.
Figure 18:
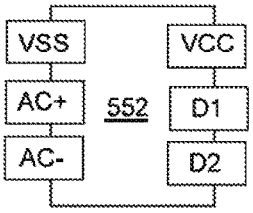
FIG. 18 shows an integrated circuit after packaging the semiconductor chip disclosed in FIG. 17.
Figure 19:
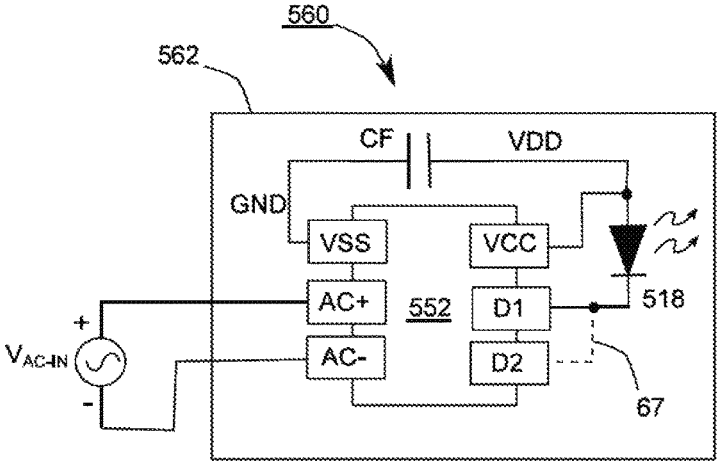
FIG. 19 shows an illumination system including an integrated circuit disclosed in FIG. 18.

In the above embodiments, the LED driver comprises a valley-filled circuit, but the disclosure presented is not restricted to this embodiment. FIG. 16 shows another LED driver 500 to drive LED 518, which comprises several LED groups 5201, 5202 and 5203 connected in series. No valley-filled circuit is used in LED driver 500. The bridge rectifier 502 and the current driver 504 in the LED driver 500 can be integrated in a single semiconductor chip to be packaged as an integrated circuit. FIG. 17 shows a pattern of a metal layer 104 on a semiconductor chip 550 and the relative positions of diode and HEMT are marked. The semiconductor chip 550 integrates the bridge rectifier 502 and the current driver 504 in the LED driver 500. FIG. 18 shows an integrated circuit 552 after packaging the semiconductor chip 550 in FIG. 17. FIG. 19 shows an illumination system 560 including the integrated circuit 552 in FIG. 18. Embodiments in FIG. 16 to FIG. 19 can be realized through above description so the details are omitted for brevity. According to FIG. 19, the illumination system 560 is realized by very small amount of electrical elements including a capacitor CF, an integrated circuit 552 and an LED 518. The cost of the illumination system 560 is reduced, and the final product is more compact.

Figure 20:
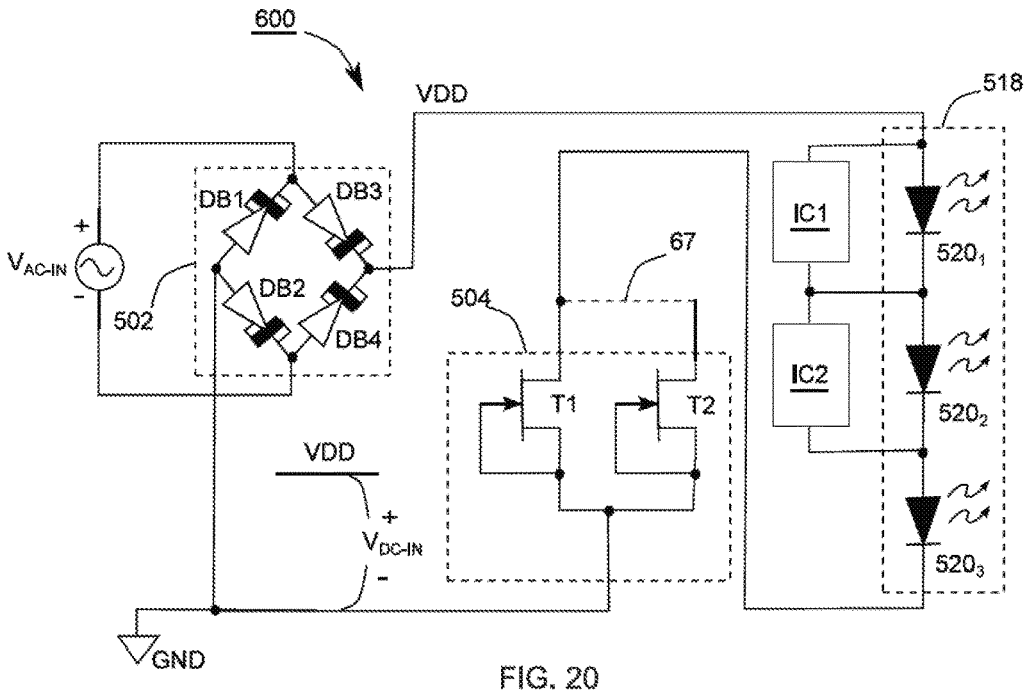
FIG. 20 shows a circuit of an LED driver disclosed in another embodiment of the present disclosure.

Embodiments in FIG. 16 and FIG. 19 are not limitations to restrict application of the integrated circuit 552. FIG. 20 shows an LED driver 600 to explain another embodiment including the bridge rectifier 502 and the current driver 504. In FIG. 20, the HEMT T1 and HEMT T2 in the current driver 504 are optionally adopted to drive the LED 518, which comprises LED groups 5201, 5202 and 5203. The LED driver 600 has dimming circuits IC1 and IC2, wherein the circuits can be turned on or turned off according to the voltage level of the DC power source $V_{DC\text{-}IN}$. For example, while the voltage level of the power source $V_{DC\text{-}IN}$ is higher than the forward voltage of the LED group 5203, the circuits IC1 and IC2 are turned on so the LED group 5203 emits light and the LED groups 5201 and 5202 do not. When the DC power source $V_{DC\text{-}IN}$ is increased to a level larger than a sum of the forward voltages of LED groups 5202 and 5203, the circuit IC1 is turned on and the circuit IC2 is turned off so the LED groups 5202 and 5203 emit light while the LED group 5201 does not. When the DC power source $V_{DC\text{-}IN}$ is increased to a level larger than a sum of the forward voltages of LED group 5201, 5202 and 5203, the circuit IC1 and the circuit IC2 are turned off so the LED groups 5201, 5202 and 5203 emit light so the electric-light conversion efficiency is better and the power factor and THD (total harmonic distortion) can be well controlled.

The integrated circuit disclosed in the present disclosure is not limited to integrating a bridge rectifier and a current driver. The integrated circuits 130 and 522 are embodiments as examples. Another integrated circuit disclosed in the present disclosure includes not only the bridge rectifier and the current driver, but also some diodes and HEMTs which are able to be used in the circuit IC1 and circuit IC2 in FIG. 20.

Integrated circuit disclosed in the present disclosure is not limited to depletion-mode HEMT. In an embodiment, the integrated circuit comprises an enhance mode HEMT, and the conducting current can be controlled by providing proper gate voltage. Thus, the light intensity emitted by the LED group can be changed. For example, the gate voltage of the enhance mode HEMTs can be adjusted to change the current entering the LED groups 5201, 5202 and 5203 while the circuit IC1 and IC2 are adopted to turn the LED groups 5201, 5202, and 5203 on and off so the light intensities from the LED groups 5201, 5202, and 5203 can be changed.

Figure 21:
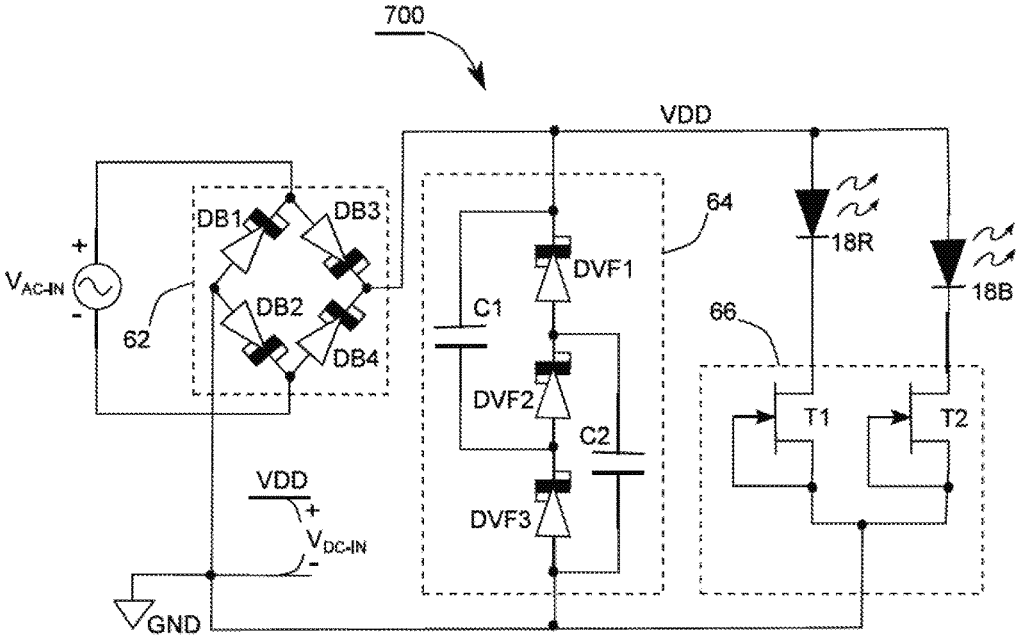
FIG. 21 shows an LED driver disclosed in another embodiment of the present disclosure.

Although the LED driver disclosed above is used to drive one LED 518, the presented disclosure is not limited to these embodiments. In an embodiment, two or more LEDs are respectively controlled by different currents. FIG. 21 shows an LED driver 700, wherein the LED 18R and LED 18B are respectively driven by the HEMT T1 and HEMT T2. For example, the current provided by the HEMT T1 is less than the current provided by HEMT T2, and the LED 18R is substantially a red light LED and the LED 18D is substantially a blue light LED.

Figure 22:
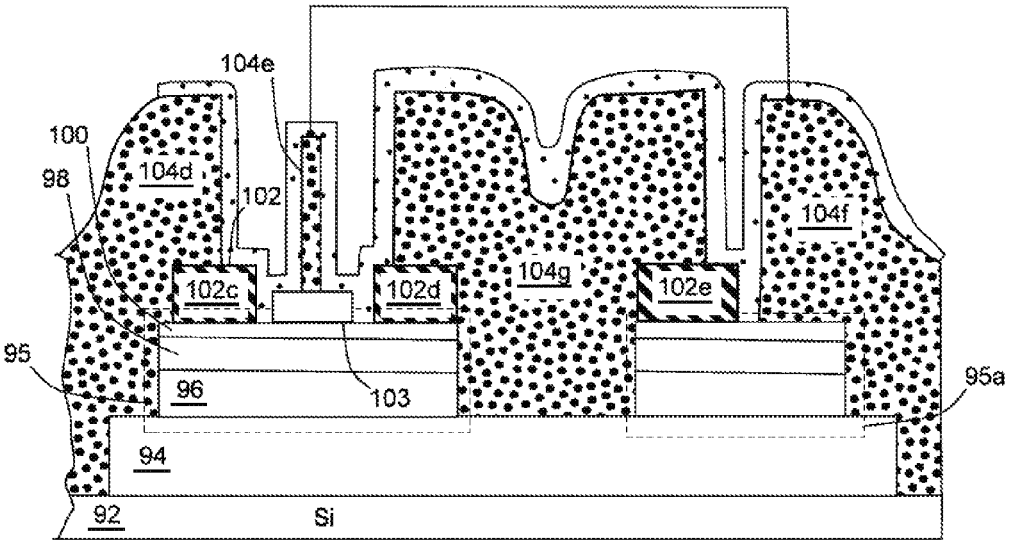
FIG. 22 shows a cross-sectional view of a diode disclosed in another embodiment of the present disclosure.

Diodes in FIG. 6 and in FIG. 13 are respectively formed on a mesa 95, but the disclosure presented is not restricted to these embodiments. FIG. 22 shows a cross-sectional view of an LED chip disclosed in an embodiment of the present disclosure. The same or similar parts in FIG. 6, FIG. 13, and FIG. 22 are omitted for brevity. Two mesas 95 and 95a are included in the embodiment shown in FIG. 22. The metal strip 102e forms an ohmic contact on the mesa 95a and the metal strip 102d forms another ohmic contact on the mesa 95. Metal strip 102d is electrically connected to the metal strip 102e through metal strip 104g. The metal strip 104f is configured as an anode of a diode and the metal strip 104d is configured as a cathode of the diode. The structure in FIG. 22 provides better breakdown voltage protection.

Figure 23:
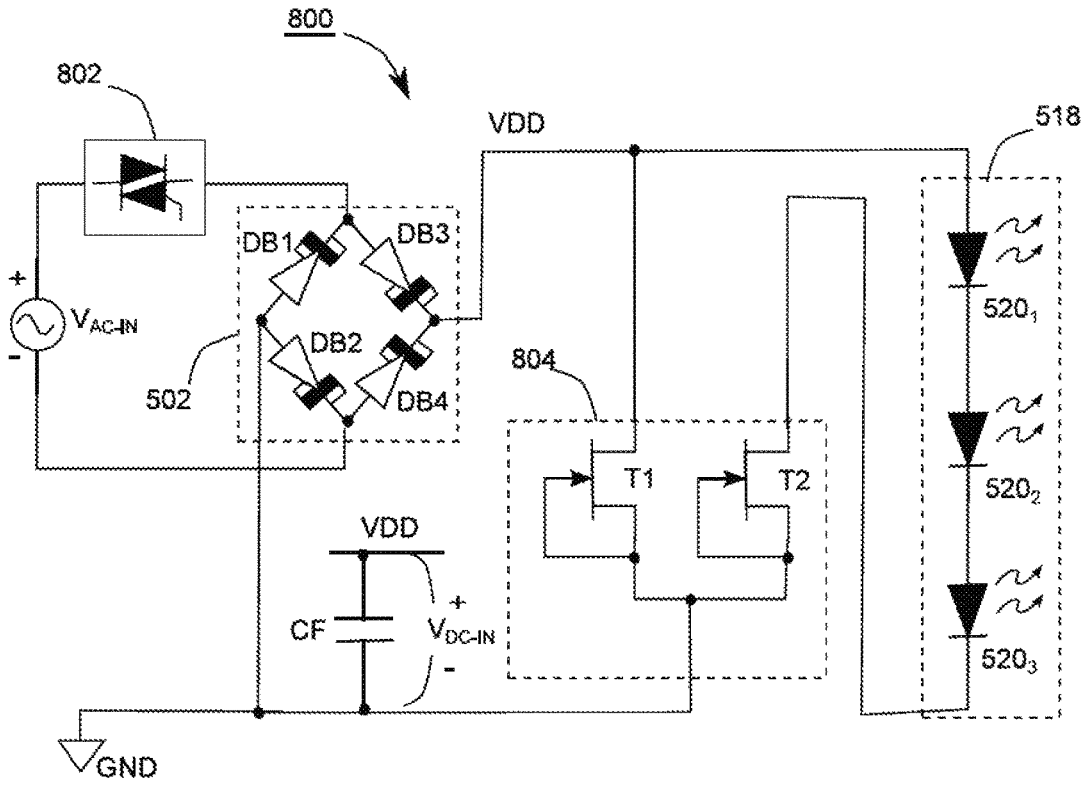
FIG. 23 shows an LED driver disclosed in further another embodiment of the present disclosure.

Current drivers 66, 302, and 504 disclosed above are configured to drive an LED, but the presented disclosure is not limited to these embodiments. FIG. 23 shows another LED driver 800 disclosed in the present disclosure. The same or similar parts in FIG. 16 and FIG. 23 are omitted for brevity. The difference between the LED driver 500 in FIG. 16 and the LED driver 800 in FIG. 23 is the TRIAC dimmer 802 included in the LED driver 800. Moreover, the HEMT T1 in the current driver 804 is directly connected between the DC power line VDD and the ground power line GND without driving any LED. When the TRIAC dimmer 802 is turned off as open state, a holding current (at a predetermined amount) is needed to prevent false action of (turning off) the LED driver 800. In FIG. 23, the HEMT T1 is configured to provide the holding current according to the requirement of the TRIAC dimmer 802. From design point of view, the HEMT T2 is configured to provide a relative large current to turn on the LED 518 to emit light and the HEMT T1 is configured to provide a relative small current to be a holding current required by the TRIAC dimmer 802 when the LED 518 does not emit light to avoid false action of turning off the LED 518.

The diodes above are presented as the symbol of diode 120 in FIG. 6, wherein the diode is composed of a HEMT and a Schottky Barrier diode. All the diodes in the embodiments can be totally or partially substituted by a diode of other species. For example, FIG. 24 shows a bridge rectifier 806 which contains four Schottky Barrier diodes SBD1, SBD2, SBD3 and SBD4.

Figure 24:
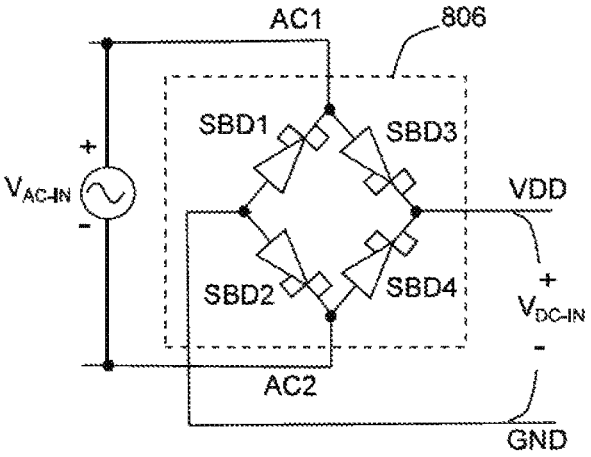
FIG. 24 shows a bridge rectifier disclosed in further another embodiment of the present disclosure.
Figure 25:
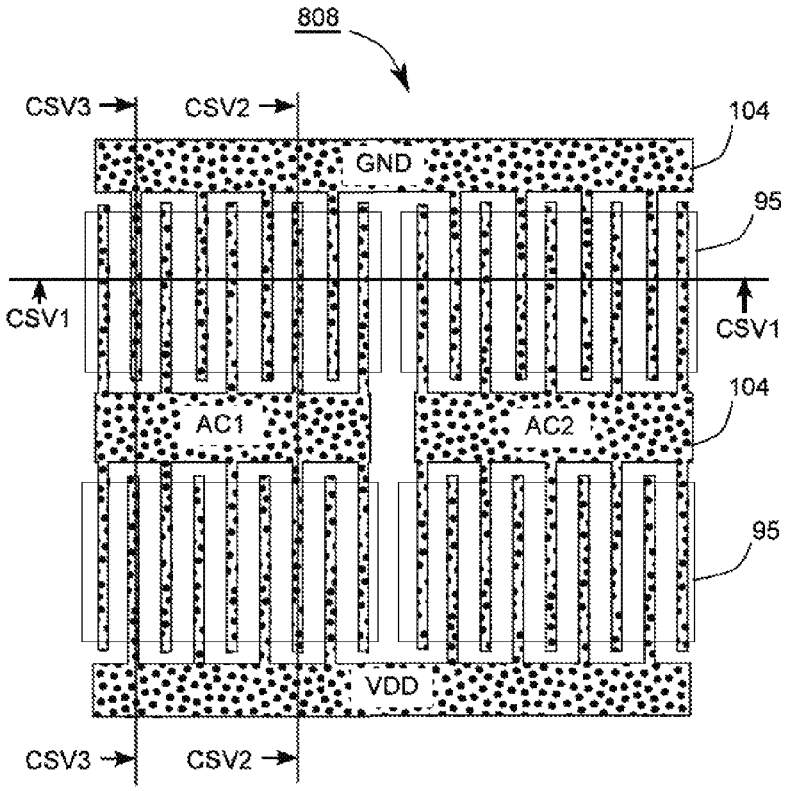
FIG. 25 shows a semiconductor chip having a bridge rectifier disclosed in FIG. 24.
Figure 26A:
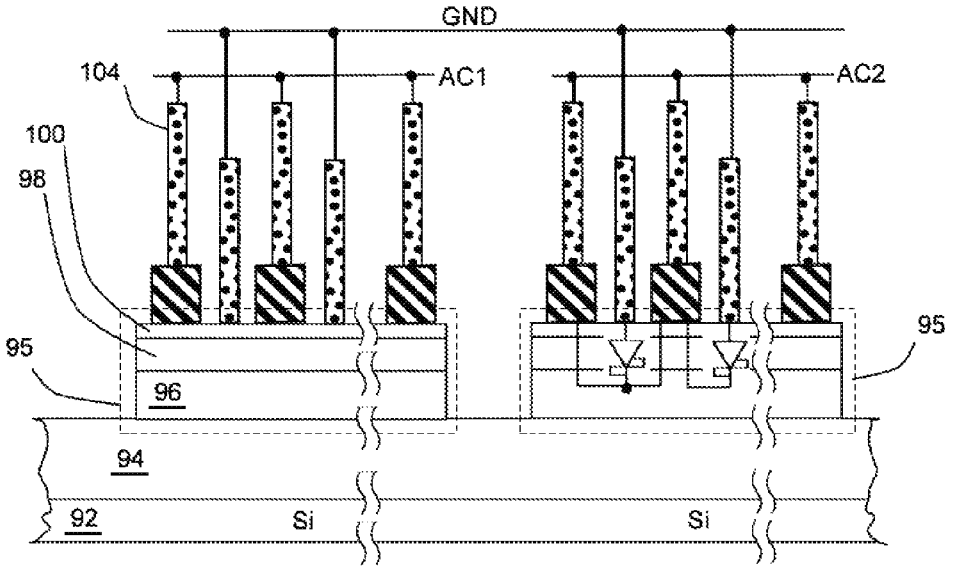
FIGS. 26A-26C show cross-sectional views of a chip along lines CSV1-CSV1, CSV2-CSV2, and CSV3-CSV3.
Figure 26B:
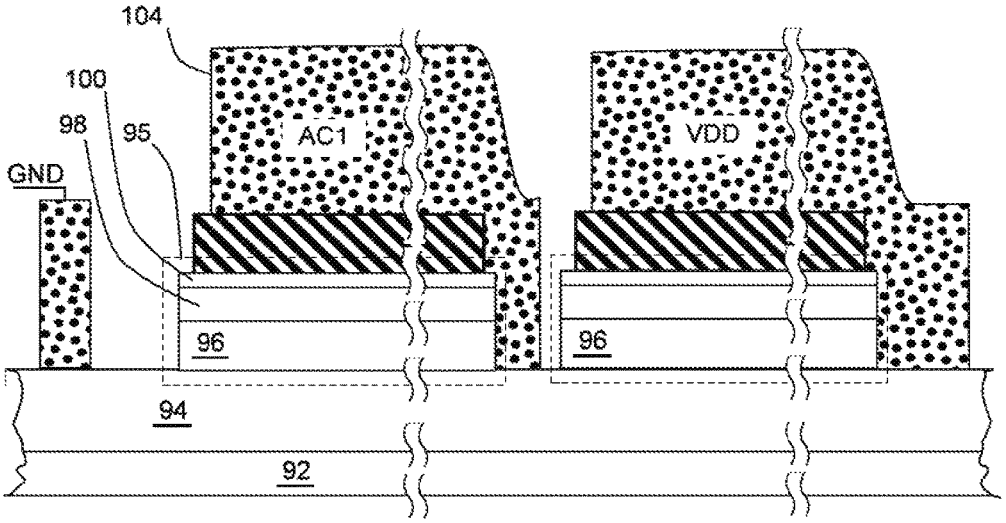
Figure 26C:
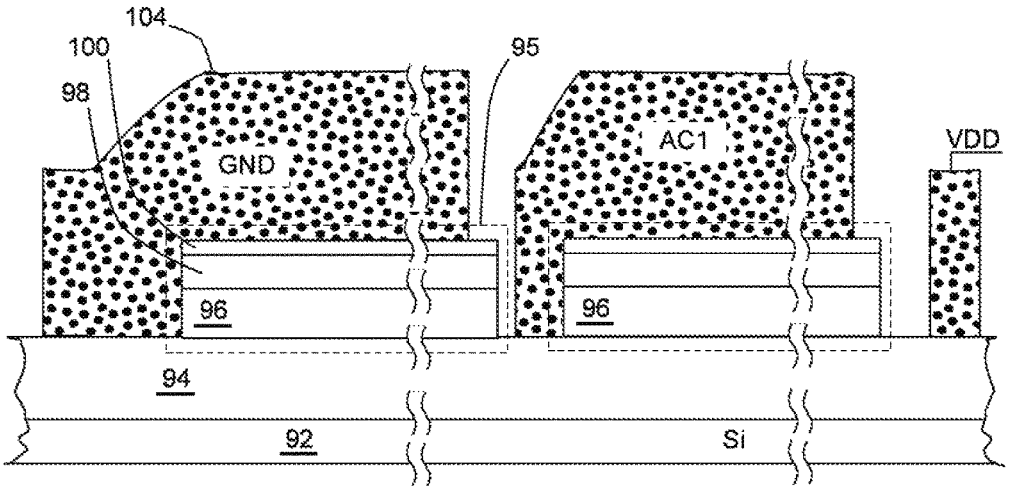

FIG. 25 shows the metal layer 104 and the mesa 95 on the semiconductor chip 808 to realize the bridge rectifier 806 in FIG. 24. FIGS. 26A, 26B and 26C are cross-sectional views of the semiconductor chip 808 along lines CSV1-CSV1, CSV2-CSV2, and CSV3-CSV3. For example, the Schottky Barrier diode SBD1 in FIG. 24 is connected between the AC power line AC1 and the ground power line GND. FIG. 25 and FIG. 26A show a HEMT with multi-finger structure. The gate node of the HEMT is used to be the anode of the Schottky Barrier diode SBD1 and the channel node of the HEMT is used to be the cathode of the Schottky Barrier diode SBD1. The Schottky Barrier diode can be electrically realized by multi Schottky Barrier diodes of smaller size connected in parallel. The HEMT having multi-finger structure can provide a larger current within a limited chip area.

Figure 27:
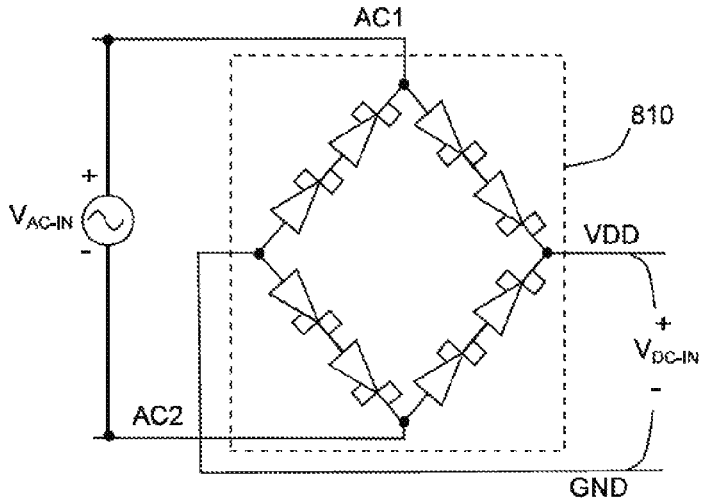
FIG. 27 shows a bridge rectifier disclosed in further another embodiment of the present disclosure.
Figure 28:
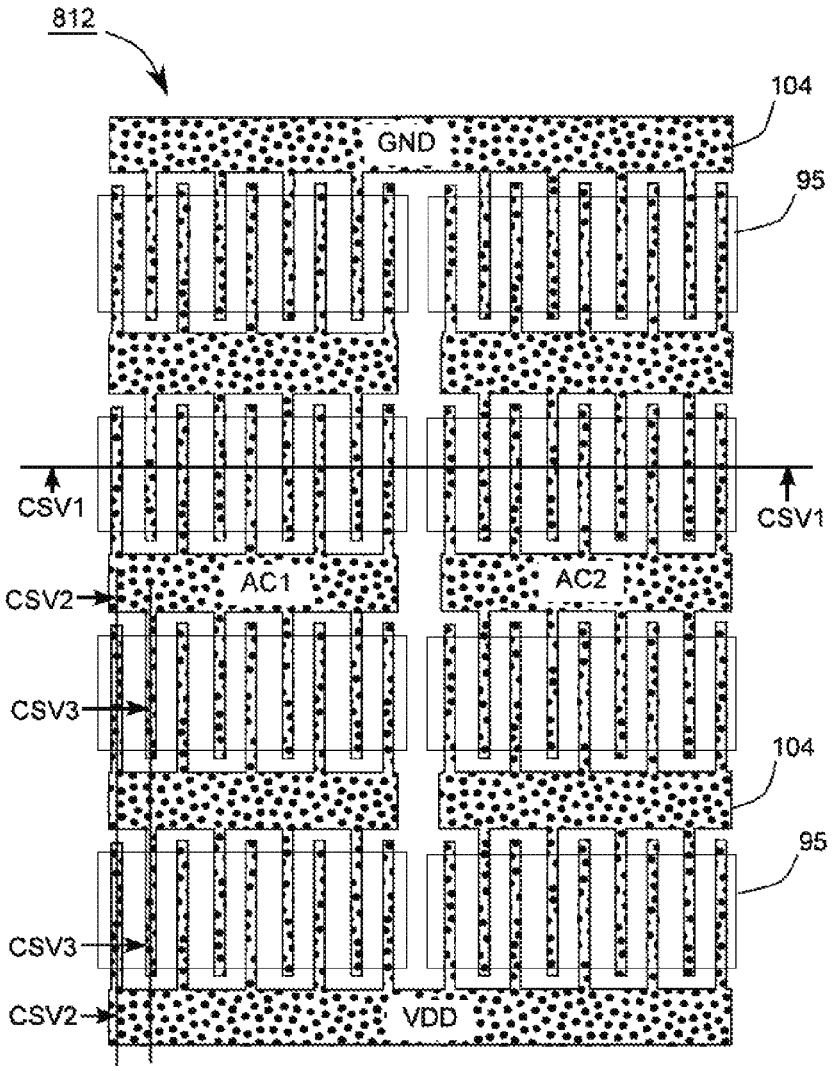
FIG. 28 shows a semiconductor chip having a bridge rectifier disclosed in FIG. 27.

In the above embodiments, each of the diodes can be realized by serially connecting several diodes of smaller size as shown in FIG. 27. FIG. 27 shows another bridge rectifier 810. For example, two Schottky Barrier diodes are serially connected between the AC power line AC1 and the ground power line GND. As an example in FIG. 28, the metal layer 104 and the mesa 95 on the semiconductor chip 812 can be used to realize a bridge rectifier 810 in FIG. 27. FIGS. 26A, 26B, and 26C can be used to show cross-sectional views of the semiconductor chip 812 along lines CSV1-CSV1, CSV2-CSV2, and CSV3-CSV3.

Figure 29A:
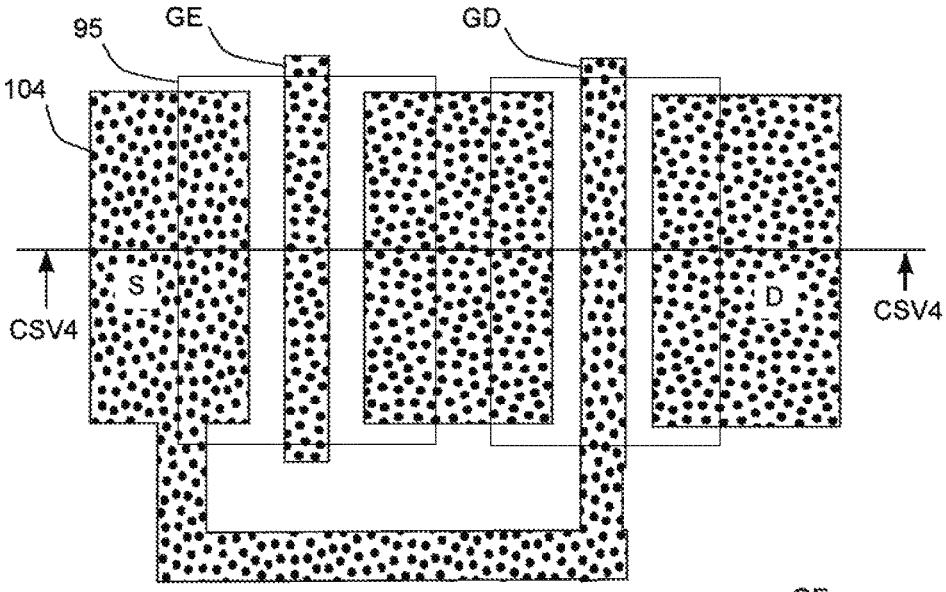
FIG. 29A shows an enhance mode HEMT ME and a depletion mode HEMT MD disclosed in further another embodiment of the present disclosure.
Figure 29B:
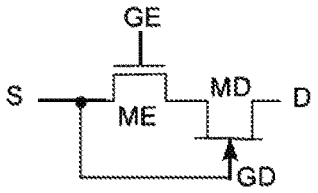
FIG. 29B shows an electrical connection between the HEMTs MD and ME.
Figure 30:
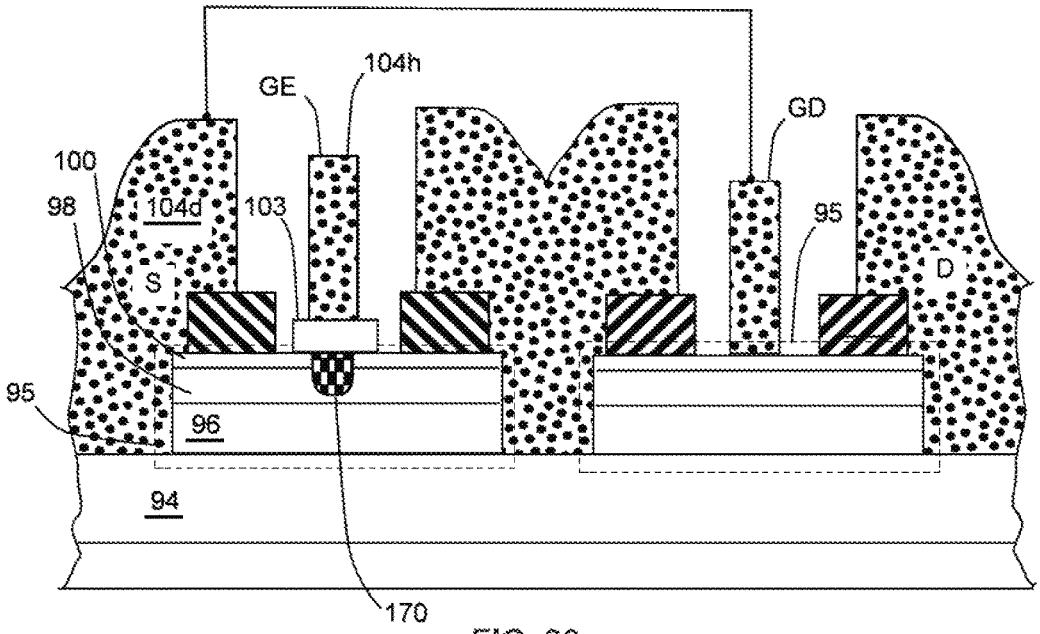
FIG. 30 shows a cross-sectional view of the chip along the line CSV4-CSV4 FIG. 29A.

As shown above, the semiconductor chips disclosed in the disclosure are not limited to depletion mode HEMT and Schottky Barrier diode and can also be enhance mode HEMT. FIG. 29A shows the metal layer 104 and the mesa 95 of the enhance mode HEMT ME and the depletion mode HEMT MD. FIG. 29B shows an electrical connection between the HEMT MD and ME in FIG. 29A. FIG. 30 shows a cross-sectional view of the chip in FIG. 29A along the line CSV4-CSV4. As shown in FIG. 30, the left part is an enhance mode HEMT ME, wherein an insulation layer 103 is formed between the metal strip 104h (configured as a gate electrode GE) and the cover 100. The part of the cover 100 and the part of the high-band gap layer 98 below the metal strip 104h form a modification area 170. For example, the modification area 170 can be formed by partially implanting the fluorine ions into the cover 100 and into the high-band gap layer 98. Compared with the depletion mode HEMT MD in the left part of FIG. 22, a modification area 170 and an insulation layer 103 are included in the enhance mode HEMT ME in the left part of FIG. 30. Both of the modification area 170 and the insulation layer 103 are configured to adjust or increase a threshold voltage of a HEMT.

As shown in FIGS. 29A, 29B, and 30, the gate electrode GD of the depletion mode HEMT MD is directly connected to the node S of the enhance mode HEMT ME. In another embodiment, the gate electrode and the node S are connected through an additional metal strip or metal layer.

Referring to circuit shown in FIG. 29B, the voltage applied from the node D to the node S is shared by the HEMT ME and HEMT MD while the HEMT ME is turned off (in an open state) so the circuit in FIG. 29B is able to receive high voltage. When the HEMT ME is turned on (in a conductive state), the HEMT MD is configured as a constant current source to eliminate the maximum current value between the node D and the node S.

Figure 31:
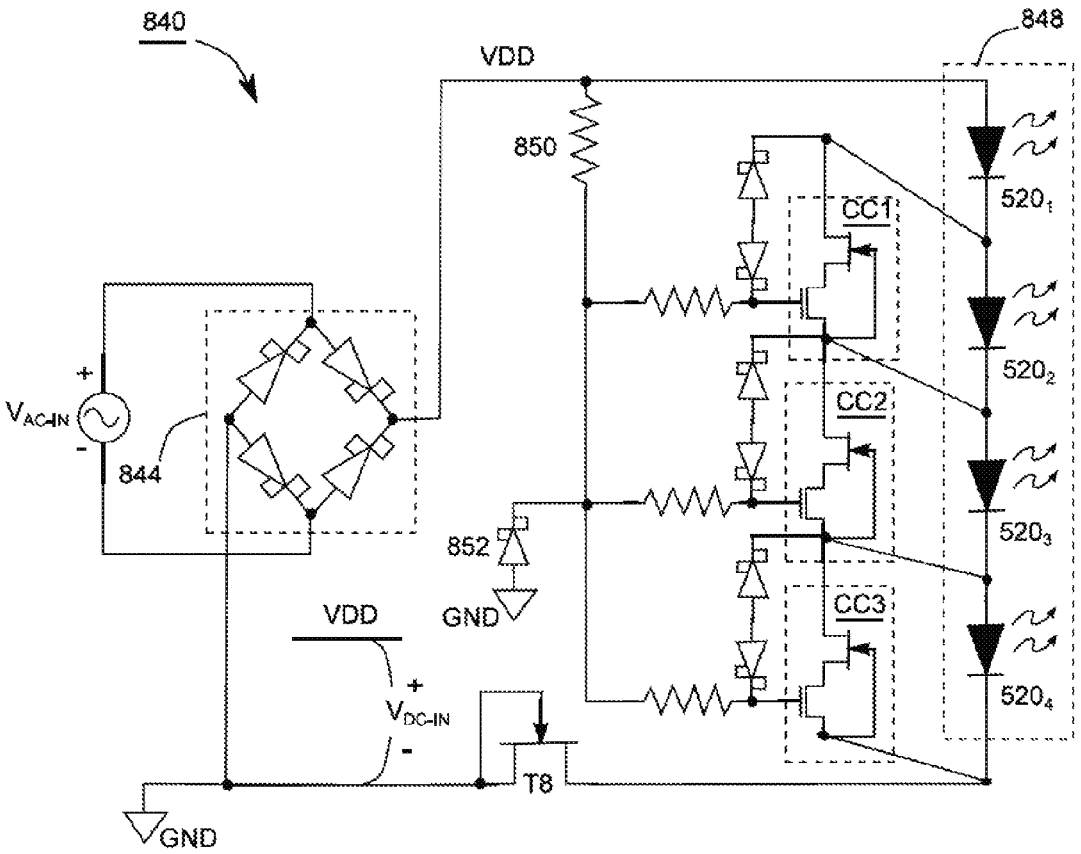
FIG. 31 shows an LED driver disclosed in another embodiment of the present disclosure.

The enhance mode HEMTs in FIG. 29A and FIG. 29B can be used as switches in a semiconductor chip. FIG. 31 shows an LED driver 840 disclosed in an embodiment of the present disclosure. The LED driver 840 includes an enhance mode HEMT and a depletion mode HEMT. Besides some Schottky Barrier diodes and resistors, the depletion mode HEMT T8 and current switches CC1, CC2, and CC3 are included in the LED driver 840, wherein the electrical connections between the elements are shown in FIG. 31. The current switches CC1, CC2, and CC3 can be realized by structures shown in FIG. 39A and FIG. 30. In an embodiment, the maximum current allowed passing through the current switches CC1, CC2, CC3 and the depletion mode HEMT T8 are current I1, I2, I3 and I4 respectively, and the I1<I2<I3<I4. Every current switches CC1, CC2, and CC3 are respectively connected to a control end, which is the gate electrode of an enhance mode HEMT, through corresponding resistors to a Schottky Barrier diode 852 commonly. One end of the Schottky Barrier diode 852 is connected to the resistors and the other end of the Schottky Barrier diode 852 is connected to the ground power line GND.

Figure 32:
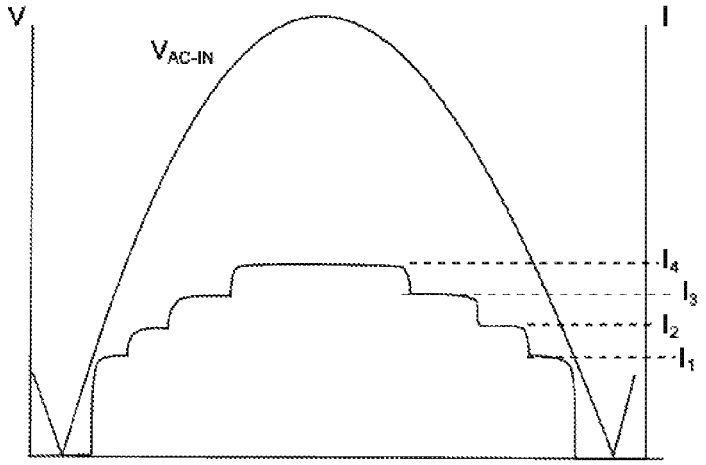
FIG. 32 shows a waveform of the AC input power and a waveform of a current passing through the bridge rectifier 844.

FIG. 32 shows a waveform of voltage provided by the AC input power $V_{AC\text{-}IN}$ and a waveform of a current passing through the bridge rectifier 844. The switches CC1, CC2, and CC3 are sequentially turned on with the increase of the voltage between the DC power line VDD and the ground power line GND from 0 volt. At the beginning, the LED group 5201 emits light, and the LED groups 5202, 5203, and 5204 do not emit light. The driving current passing through LED group 5201 is limited by the current switch CC1, and the maximum value of the current is I1. With the increase of voltage between the DC power line VDD and the ground power line GND, the current switch CC1 is turned off, and the LED group 5202 joins to emit a light. In this state, the driving current passing through the LED groups 5201 and 5202 is limited by the current switch CC2, and the maximum value of the current is I2. With further increase of voltage between the DC power line VDD and the ground power line GND, the current switch CC2 is turned off, and the LED group 5203 is added to emit a light. In this state, the driving current passing through the LED groups 5201, 5202, and 5203 is limited by the current switch CC3, and the maximum value of the current is I3. When the voltage between the DC power line VDD and the ground power line GND exceeds a specific value, the current switches CC1, CC2, and CC3 are closed, and the LED groups 5201, 5202, 5203, and 5204 emit a light. In this state, the driving current passing through the LED groups 5201, 5202, 5203 and 5204 is limited by the depletion mode HEMT T8, and the maximum value of the current is I4. When the voltage between the DC power line VDD and the ground power line GND decreases from the maximum value, the current switches CC3, CC2 and CC1 are turned on sequentially. Referring to FIG. 32, the LED driver 840 in FIG. 31 has not only good power factor but also low THD (total harmonic distortion).

The current switches CC3, CC2, and CC1 are respectively connected to two Schottky Barrier diodes reversely connected in series, which are connected to the control end and a high voltage end corresponding to each of the current switches. In another embodiment, these Schottky Barrier diodes, such as the six Schottky Barrier diodes in FIG. 31A, are omitted in consideration of cost.

The Schottky Barrier diode 852 connected between the resistor 850 and the ground power line GND can be used to restrict the maximum value of the voltage applied on the control ends of current switches CC3, CC2, and CC1. When a surge voltage happens on the DC power line VDD, the Schottky Barrier diode 852 is used to prevent the enhance mode HEMT from burning caused by too large gate voltage.

All the Schottky Barrier diodes and HEMT in the LED driver 840 in FIG. 31 can be integrated in a single crystal micro-wave integrated circuit having GaN-based channel. For example, the Schottky Barrier diode can be realized by the element structure shown in FIG. 6 or FIG. 26A, and the enhance mode HEMT and the depletion mode HEMT can be realized by the left part and the right part in FIG. 30 respectively. In other words, an LED driver 840 may be realized by a single crystal micro-wave integrated circuit, some passive elements (such as resistors), an LED 848 and a PCB (printed circuit board), and the cost is lower.

With the increase of environment temperature, the light intensity from an LED driven by a constant current may be decreased. In order to compensate the decrease form temperature, a thermistor with NTC (negative thermal coefficient) or PTC (positive thermal coefficient) can be applied to adjust the driving current entering the LED.

Figure 33:
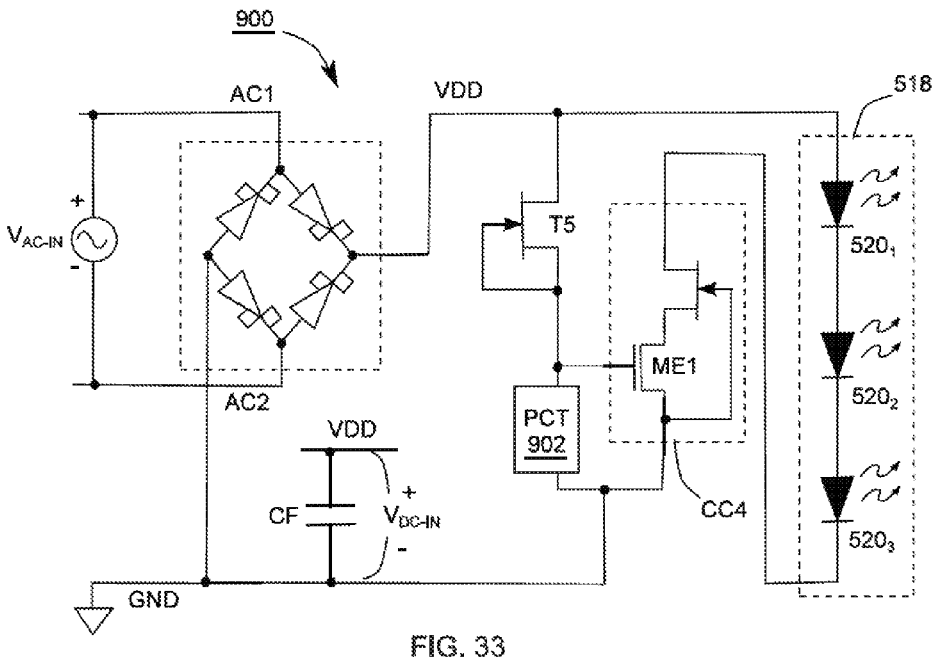
FIG. 33 shows an LED driver having a thermistor of positive temperature coefficient.

FIG. 33 shows an LED driver 900 having a thermistor with positive temperature coefficient, wherein the two nodes of the thermistor 902 are connected to a gate end and a channel end of a HEMT ME1 respectively. The depletion mode HEMT T5 is configured as a constant current source to provide a substantially constant current through the thermistor 902. The enhance mode HEMT ME1 is operated within the linear region. When the environment temperature is increased, the resistance value of the thermistor 902 is increased, so the voltage applied to the gate end is increased to increase current passing through the LED 518. Thus, the amount of light emitted from the LED 518 is substantially unchanged with the variation of temperature.

Figure 34:
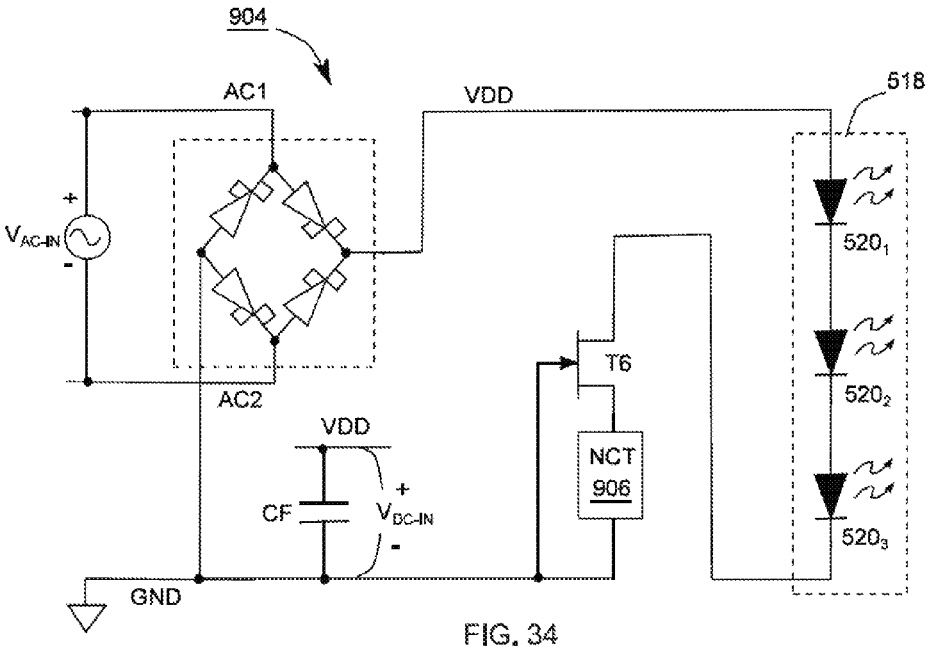
FIG. 34 shows an LED driver having a thermistor of negative temperature coefficient.

FIG. 34 shows an LED driver 906 having a thermistor with negative temperature coefficient. The depletion mode HEMT T6 can be used as a constant current source, and the constant provided is substantially controlled by its source voltage. When the temperature increases, the resistance of the thermistor 906 decreases so the source voltage of the depletion mode HEMT T6 is decreased and the voltage between the gate and to the source end of the depletion mode HEMT is increased. Therefore, the current passing through the LED 518 is increased. Thus, the amount of light emitted from the LED 518 is substantially unchanged with the variation of temperature.

Figure 35:
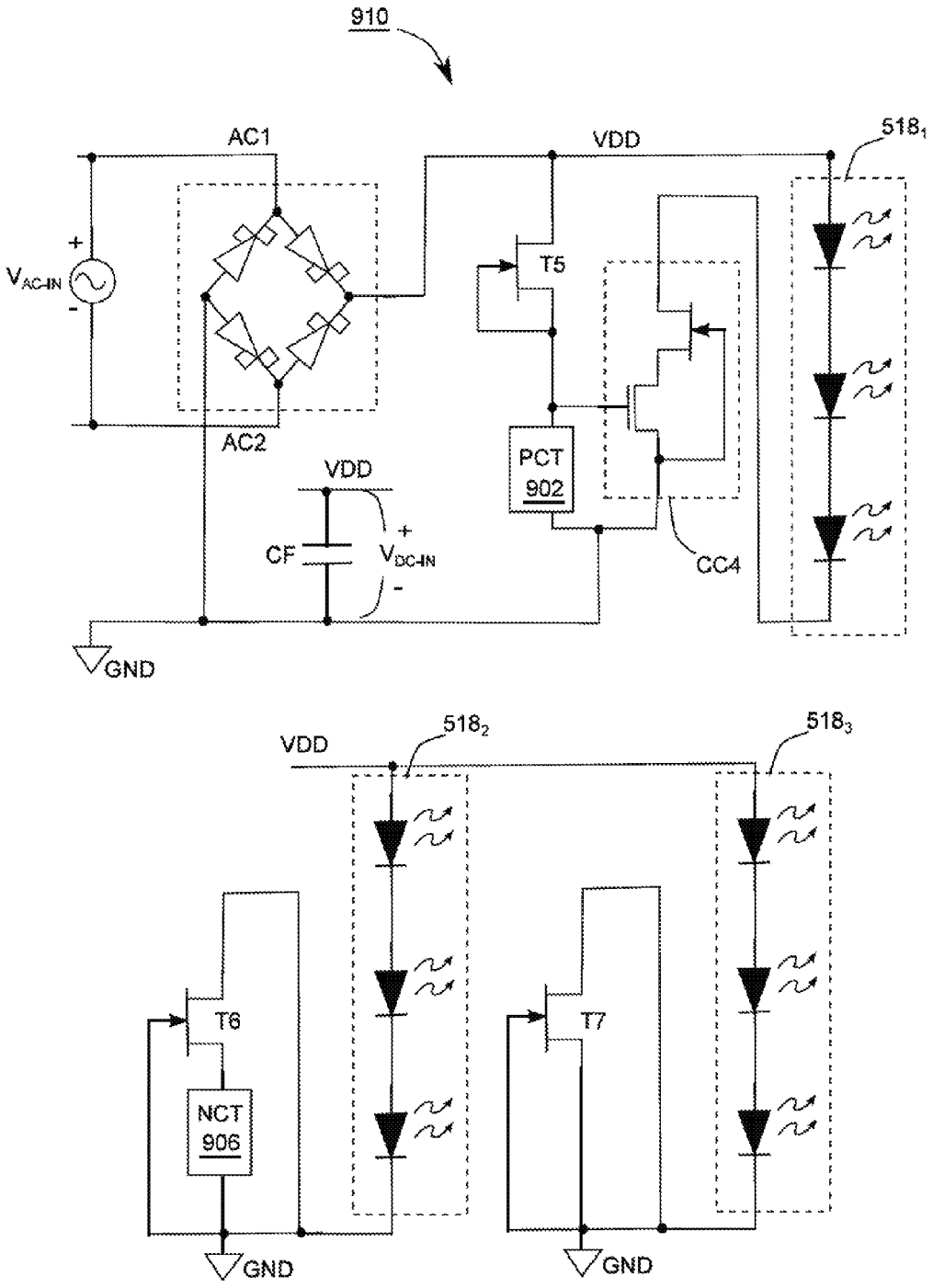
FIG. 35 shows an LED driver having a thermistor disclosed in the present disclosure.

The LED driver disclosed in the present disclosure is not restricted to one LED or one thermistor. FIG. 35 shows an LED driver 910 having LEDs 5181, 5182 and 5183. Similar with the disclosure in FIG. 33, the driving current passing through the LED 5181 is controlled by the thermistor 902 and the current is increased with the increase of temperature. Similar with the circuit in FIG. 34, the driving current passing through the LED 5182 is controlled by the thermistor 906 and the current is increased with the increase of temperature. The driving current passing through the LED 5183 is controlled by a depletion mode HEMT T7, and the current is substantially unchanged with variance with temperature. In an embodiment, the LED 5183 is a blue light LED and the LED 5181 or 5182 is a red light LED.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A driver [for connecting to a power line and a ground power line], comprising:

a buffer layer, comprising a GaN based material;

a bridge rectifier formed on the buffer layer, comprising a rectifying diode, *wherein the rectifying diode com-*

*prises a first high electron mobility transistor and a metal strip, wherein the first high electron mobility transistor comprises a gate and a first mesa providing a 2D-electron gas, and the metal strip is in Schottky contact with the first mesa, wherein the gate of the first high electron mobility transistor is electrically connected to the metal strip*; and a constant current source formed on the buffer layer, *comprising a second mesa providing another 2D-electron gas,* wherein the first constant current source is [connected between the power line and the ground power line] *electrically connected to the rectifying diode and configured* to provide a constant current.

2. The driver according to claim 1, *wherein the constant current source* further [comprising] *comprises* a high electron mobility transistor [within the constant current source, wherein the high electron mobility transistor has a first arm,] *having* a gate area, *a first arm on a side of the gate area* and a second arm on [a] *an opposite* side of the gate area [opposite to the first arm].

3. The driver according to claim 2, wherein the first arm, the gate area and the second arm are patterned from a same metal layer.

4. A driver, comprising:

a [bridge] rectifier;

a first thermistor and a second thermistor, wherein the second thermistor has a temperature coefficient different from that of the first thermistor;

a first constant current source *electrically* connected to the first thermistor [in parallel];

a second constant current source *electrically* connected to the second thermistor [in parallel]; and a third constant current source;

wherein [the bridge rectifier includes an end connected to] the first constant current source, the second constant current source and the third constant current source *are connected to the rectifier*.

5. The driver according to claim 4, wherein the first thermistor has a positive temperature coefficient.

6. The driver according to claim 4, *wherein the first constant source* further [comprising] *comprises* an enhance mode high electron mobility transistor [within the first constant current source, wherein the enhance mode high electron mobility transistor has] *having* a cover layer, an insulation layer, and a modification area.

7. The driver according to claim 6, wherein the modification area has a width narrower than that of the insulation layer.

*8. The driver according to claim 1, further comprising a base,*

*wherein the buffer layer is formed on a base and comprises a continuous surface, and*

*wherein the bridge rectifier and the constant current source are formed on the continuous surface.*

*9. The driver according to claim 8, wherein the base comprises a material different from that of the buffer layer.*

*10. The driver according to claim 9, wherein the constant current source comprises a material same as that of the buffer layer.*

*11. The driver according to claim 1, wherein each of the first mesa and the second mesa comprises a channel layer.*

*12. The driver according to claim 11, wherein the 2D-electron gas is formed in the channel layer of the first mesa, and the another 2D-electron gas is formed in the channel layer of the second mesa.*

* * * * *